(12) United States Patent  
Yamada et al.

(10) Patent No.: US 12,317,662 B2
(45) Date of Patent: May 27, 2025

(54) DISPLAY DEVICE AND METHOD FOR INSPECTING DISPLAY DEVICE

(71) Applicant: SHARP KABUSHIKI KAISHA, Sakai (JP)

(72) Inventors: Junichi Yamada, Sakai (JP); Takehiko Kawamura, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 490 days.

(21) Appl. No.: 17/768,407

(22) PCT Filed: Oct. 25, 2019

(86) PCT No.: PCT/JP2019/041978
§ 371 (c)(1),
(2) Date: Apr. 12, 2022

(87) PCT Pub. No.: WO2021/079503
PCT Pub. Date: Apr. 29, 2021

(65) Prior Publication Data
US 2023/0275198 A1  Aug. 31, 2023

(51) Int. Cl.
H10H 20/857 (2025.01)
H01L 25/075 (2006.01)

(52) U.S. Cl.
CPC ....... H10H 20/857 (2025.01); H01L 25/0753 (2013.01)

(58) Field of Classification Search
CPC ............. H01L 33/62; H01L 25/0753; H01L 27/1214–1296; H01L 27/124; H01L 27/1255; H01L 27/32; H01L 27/3293; H01L 27/3276; H01L 27/3288; H01L 27/3297; H05B 33/02; H05B 33/06; H05B 33/12; H05B 33/22; H05B 33/26; G09G 3/3233; G09G 2300/0426; G09G 2300/0819; G09G 2300/0842; G09G 2300/0861; G09G 3/006; G09G 2330/12; G09G 2300/0452; H10K 50/88; H10K 71/861; H10K 71/70; H10K 59/873; H10K 59/131; H10K 59/173; H10K 59/179; H10K 59/82; H10K 59/8722; H10K 59/8723; H10K 59/8792; H10K 59/88

(Continued)

(56) References Cited

U.S. PATENT DOCUMENTS

2017/0278912 A1* 9/2017 Kim .................... H10K 59/8722
2018/0032189 A1* 2/2018 Lee ........................ G09G 3/3266

(Continued)

FOREIGN PATENT DOCUMENTS

JP 2002-350802 A 12/2002
KR 20170080224 A 7/2017
WO WO-2018179308 A1 * 10/2018 ............. G09F 9/301

OTHER PUBLICATIONS

Hirase et al., Display device and production method thereof, 2018, machine translation of WO-2018179308-A1, pp. 1-28. (Year: 2018).*

*Primary Examiner* — Natalia A Gondarenko
(74) *Attorney, Agent, or Firm* — ScienBiziP, P.C.

(57) ABSTRACT

In a display device, the metal layer includes a plurality of openings, and electrode pads having an island shape overlap one or more of the plurality of openings via an insulating film including at least a flattening film.

19 Claims, 15 Drawing Sheets

(58) Field of Classification Search
USPC .......................................... 257/79, 40, 59, 88
See application file for complete search history.

(56) References Cited

U.S. PATENT DOCUMENTS

| | | | |
|---|---|---|---|
| 2018/0277029 A1* | 9/2018 | Lee ........................ | G06F 3/0443 |
| 2020/0006452 A1* | 1/2020 | Lee ........................ | H01L 27/124 |

* cited by examiner

DISPLAY DEVICE AND METHOD FOR INSPECTING DISPLAY DEVICE

TECHNICAL FIELD

The disclosure relates to a display device and a method for inspecting a display device.

BACKGROUND ART

In recent years, various display devices including a light-emitting element have been developed. Particularly, a display device including an Organic Light Emitting Diode (OLED) and a display device including an inorganic light-emitting diode or a Quantum dot Light Emitting Diode (QLED) have drawn a great deal of attention because these devices offer advantages such as lower power consumption, smaller thickness, and higher picture quality.

In the field of these display devices, an electrode pad for analysis or inspection may be formed in the display device in advance during manufacturing processes of the display devices and used for various characteristics evaluation as necessary.

CITATION LIST

Patent Literature

PTL 1: JP 2002-350802 A (published on Dec. 4, 2002)

SUMMARY

Technical Problem

FIG. 15 is a view illustrating a schematic configuration of a known display device 100 in which a metal layer CDL is formed in a frame-like shape in a frame region NDA.

The display device 100 illustrated in FIG. 15 includes a display region DA, the frame region NDA in the periphery of the display region DA, a terminal portion TER provided at one end portion of the frame region NDA, an ELVDD voltage line serving as a first power supply voltage line, and an ELVSS voltage line serving as a second power supply voltage line.

The ELVDD voltage line includes a trunk wiring line ELVDDM formed parallel to the terminal portion TER, a plurality of branch wiring lines (not illustrated) electrically connected to the trunk wiring line ELVDDM and formed in the display region DA and the frame region NDA, and two lead wiring lines ELVDDH extending from each of a terminal TP2 and a terminal TPn-1 of the terminal portion TER and electrically connected to the trunk wiring line ELVDDM.

On the other hand, the ELVSS voltage line includes a trunk wiring line ELVSSM indicated by a dotted line in FIG. 15 provided in the frame-like shape in the frame region NDA so as to surround an end portion of the display region DA excluding a part of a bottom side in the drawing of the display region DA, and two lead wiring lines ELVSSH extending from each of a terminal TP1 and a terminal TPn of the terminal portion TER and electrically connected to the trunk wiring line ELVSSM.

Although not illustrated, the display region DA of the display device 100 includes a plurality of light-emitting elements, a plurality of thin film transistors, and a plurality of capacitance elements, and the plurality of light-emitting elements are driven by a pixel circuit including thin film transistors and capacitance elements formed in a lower layer than the plurality of light-emitting elements. Each of the plurality of light-emitting elements includes a common electrode serving as an upper layer and a reflective electrode serving as a lower layer. Since the common electrode needs to be electrically connected to the trunk wiring line ELVSSM of the ELVSS voltage line, the common electrode is formed to the entirety of the display region DA and a part of the frame region NDA, and is in direct contact with the metal layer CDL formed of the same layer and the same material as the reflective electrode in the frame region NDA, and thus the common electrode and the metal layer CDL are electrically connected to each other. The metal layer CDL is also in direct contact with the trunk wiring line ELVSSM of the ELVSS voltage line, and thus the common electrode is electrically connected to the trunk wiring line ELVSSM of the ELVSS voltage line via the metal layer CDL.

In the display device 100 having such a configuration, an electrode pad PADR for analysis or inspection may be formed as illustrated in FIG. 15. Since the electrode pad PADR for analysis or inspection is formed of the same layer and the same material as electrodes and the wiring lines of the thin film transistors and the capacitance elements formed in the lower layer than the plurality of light-emitting elements, the electrode pad PADR for analysis or inspection is in a state of being covered with the metal layer CDL formed of the same layer and the same material as the reflective electrode.

Thus, in order to perform analysis or inspection using the electrode pad PADR provided in the display device 100, it is necessary to confirm a position of the electrode pad PADR provided in the lower layer than the metal layer CDL formed of the same layer and the same material as the reflective electrode through the metal layer CDL.

However, in a case where the metal layer CDL formed of the same layer and the same material as the reflective electrode is formed on the electrode pad PADR, it is difficult to confirm the position of the electrode pad PADR provided below due to the reflection of the metal layer CDL or the like.

An aspect of the disclosure has been made in light of the problem described above, and an object of the aspect is to provide a display device and a method for inspecting a display device that can easily perform the position confirmation of the electrode pad for analysis or inspection.

Solution to Problem

In order to solve the problem described above, a display device according to the disclosure is a display device including a display region, a frame region in a periphery of the display region, and a plurality of light-emitting elements provided in the display region, wherein the display region and the frame region include a flattening film, each of the plurality of light-emitting elements provided on the flattening film includes a first electrode, a light-emitting layer, and a second electrode in this order from the flattening film side, the display region includes a first spacer between the plurality of light-emitting elements, the frame region includes a second spacer and a metal layer electrically connected to the second electrode and formed of a same layer and a same material as the first electrode, the metal layer includes a plurality of openings, the frame region includes an electrode pad having an island shape, and the electrode pad overlaps one or more of the plurality of openings via an insulating film including at least the flattening film.

In order to solve the problem described above, a method for inspecting a display device according to the disclosure is a method for inspecting a display device including a display region, a frame region in a periphery of the display region, and a plurality of light-emitting elements provided in the display region, the display region and the frame region including a flattening film, each of the plurality of light-emitting elements provided on the flattening film including a first electrode, a light-emitting layer, and a second electrode in this order from the flattening film side, the frame region including a metal layer electrically connected to the second electrode and formed of a same layer and a same material as the first electrode, the metal layer including a plurality of openings, the frame region including an electrode pad having an island shape, the electrode pad overlapping one or more of the plurality of openings via an insulating film including at least the flattening film, the method including confirming a position of the electrode pad from the one or more of the plurality of openings.

Advantageous Effects of Disclosure

According to an aspect of the disclosure, a display device and a method for inspecting a display device that can easily perform the position confirmation of the electrode pad for analysis or inspection can be provided.

DESCRIPTION OF EMBODIMENTS

Embodiments of the disclosure will be described with reference to FIGS. 1 to 14 as follows. Hereinafter, for convenience of explanation, components having the same functions as those described in a specific embodiment are appended with the same reference signs, and descriptions thereof may be omitted.

First Embodiment

Figure 1:
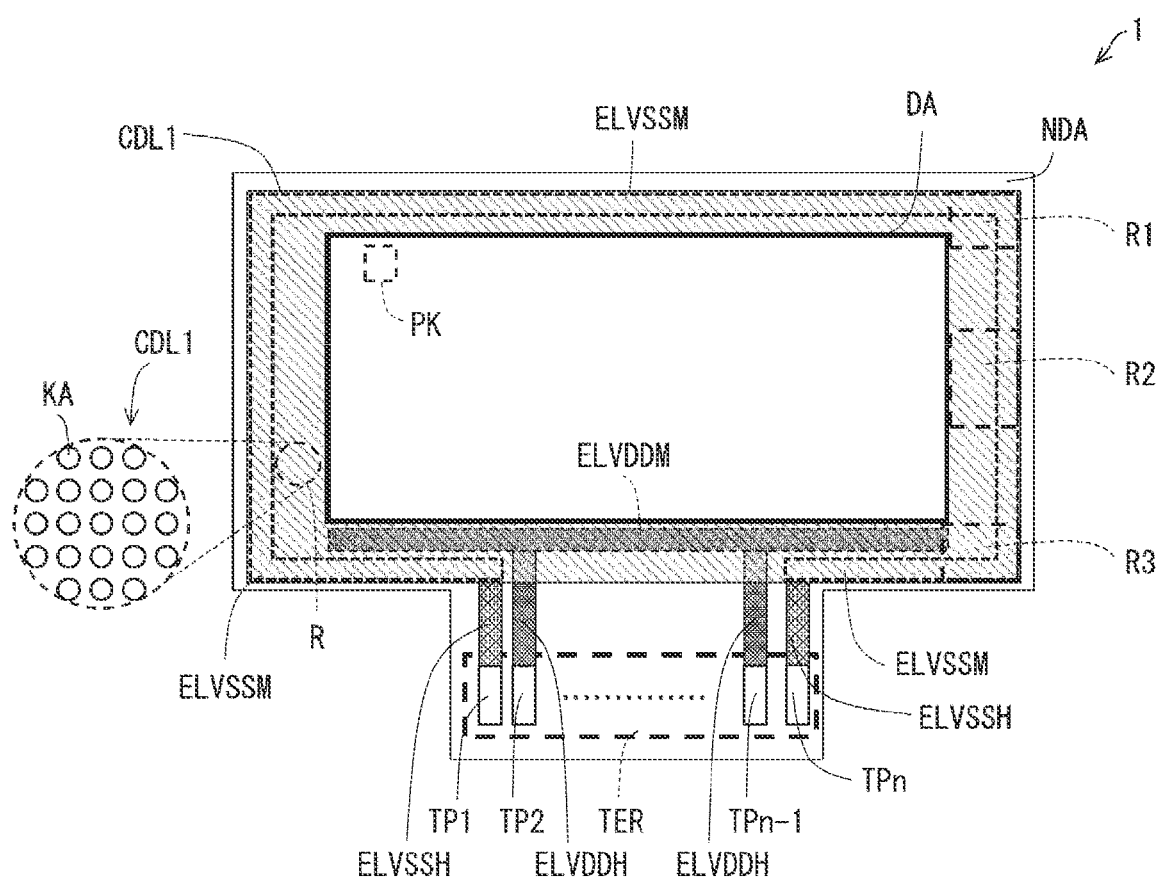
FIG. 1 is a view illustrating a schematic configuration of a display device according to a first embodiment.

FIG. 1 is a view illustrating a schematic configuration of a display device 1 according to a first embodiment.

The display device 1 illustrated in FIG. 1 includes a display region DA, the frame region NDA in the periphery of the display region DA, a terminal portion TER provided at one end portion of the frame region NDA, an ELVDD voltage line serving as a first power supply voltage line, and an ELVSS voltage line serving as a second power supply voltage line.

The ELVDD voltage line includes a trunk wiring line ELVDDM formed parallel to the terminal portion TER, a plurality of branch wiring lines (not illustrated) electrically connected to the trunk wiring line ELVDDM and formed in the display region DA and the frame region NDA, and two lead wiring lines ELVDDH extending from each of a terminal TP2 and a terminal TPn−1 of the terminal portion TER and electrically connected to the trunk wiring line ELVDDM.

On the other hand, the ELVSS voltage line includes a trunk wiring line ELVSSM provided in the frame-like shape in the frame region NDA so as to surround an end portion of the display region DA excluding a part of a bottom side in the drawing of the display region DA, and two lead wiring lines ELVSSH extending from each of a terminal TP1 and a terminal TPn of the terminal portion TER and electrically connected to the trunk wiring line ELVSSM.

Figure 5:
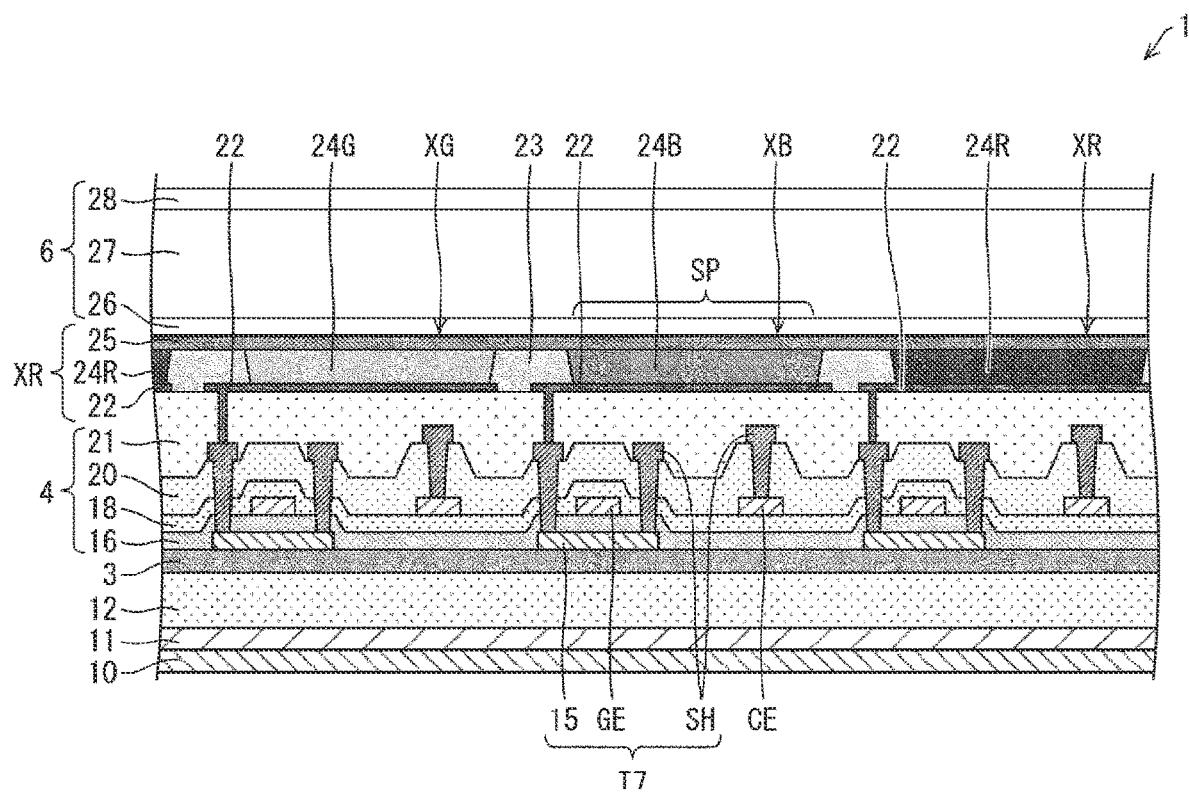
FIG. 5 is a cross-sectional view taken along a line W-W' of the display device according to the first embodiment illustrated in FIG. 4.

FIG. 5 is a cross-sectional view illustrating a schematic configuration of the display region DA of the display device 1.

As illustrated in FIG. 5, in the display region DA of the display device 1, an adhesive layer 11, a resin layer 12, a barrier layer 3, a thin film transistor layer (TFT layer) 4, light-emitting elements X (a light-emitting element XR that emits red color, a light-emitting element XG that emits green color, and a light-emitting element XB that emits blue color) and a sealing layer 6 are provided in this order on a base substrate 10.

An example of the material of the base substrate 10 includes polyethylene terephthalate (PET), but the material is not limited thereto.

Examples of the adhesive layer 11 include an optical clear adhesive (OCA) or an optical clear resin (OCR), but are not limited thereto.

Examples of the material of the resin layer 12 include a polyimide resin, an epoxy resin, and a polyamide resin, but are not limited thereto.

The barrier layer 3 is a layer configured to prevent moisture or impurities from reaching various transistors such as a second initialization transistor T7 or the light-emitting elements X (the light-emitting element XR that emit red color, the light-emitting element XG that emits green color, and the light-emitting element XB that emits blue color) and can be constituted by, for example, a silicon oxide film, a silicon nitride film or a silicon oxynitride film, or a layered film of these films that are formed using CVD. Note that in the present embodiment, a description will be given using, as an example, a case in which the display device 1 includes a circuit configuration including the second initialization transistor T7, but this is not a limitation, and the display device 1 may include a circuit configuration not including the second initialization transistor T7.

The transistor such as the second initialization transistor T7 and the capacitance element are provided as an upper layer overlying the resin layer 12 and the barrier layer 3. The thin film transistor layer 4 including the transistor such as the second initialization transistor T7 and the capacitance element includes a semiconductor film 15, an inorganic insulating film (a gate insulating film) 16 as an upper layer overlying the semiconductor film 15, a gate electrode GE as an upper layer overlying the inorganic insulating film 16, an inorganic insulating film (a first inorganic insulating film) 18 as an upper layer overlying the gate electrode GE, a counter electrode CE of a capacitance element as an upper layer overlying the inorganic insulating film 18, an inorganic insulating film (a second inorganic insulating film) 20 as an upper layer overlying the counter electrode CE of the capacitance element, a layer SH forming a source electrode, a drain electrode, and a wiring line of the electrodes as an upper layer overlying the inorganic insulating film 20, and an interlayer insulating film (a flattening film) 21 as an upper layer overlying the layer SH forming the source electrode, the drain electrode, and the wiring line of the electrodes.

Note that the capacitance element includes the counter electrode CE of a capacitance element formed directly above the inorganic insulating film 18, the inorganic insulating film 18, and a capacitance electrode formed directly below the inorganic insulating film 18 and formed overlapping the counter electrode CE of a capacitance element in the same layer as the layer that forms the gate electrode GE.

The transistor such as the second initialization transistor T7 includes the semiconductor film 15, the inorganic insulating film 16, the gate electrode GE, the inorganic insulating film 18, the inorganic insulating film 20, the source electrode and the drain electrode.

The semiconductor film 15 is formed of low-temperature polysilicon (LTPS) or an oxide semiconductor, for example.

The gate electrode GE, the counter electrode CE of the capacitance element, and the layer SH forming the source electrode, the drain electrode, and the wiring line of the electrodes are formed of a single-layer film or a layered film of a metal including at least one of aluminum (Al), tungsten (W), molybdenum (Mo), tantalum (Ta), chromium (Cr), titanium (Ti), copper (Cu), and silver (Ag), for example.

The inorganic insulating films 16, 18, and 20 may be formed of, for example, a silicon oxide (SiOx) film, a silicon nitride (SiNx) film, or a silicon oxynitride film, or of a layered film of these, formed by CVD.

The interlayer insulating film (flattening film) 21 may be formed of, for example, a coatable photosensitive organic material, such as a polyimide resin, an acrylic resin, or the like.

The light-emitting element XR that emits red color includes a first electrode 22 as a layer above the interlayer insulating film 21, a function layer 24R including a red light-emitting layer as a layer above the first electrode 22, and a second electrode 25 as a layer above the function layer 24R. The light-emitting element XG that emits green color includes the first electrode 22 as a layer above the interlayer insulating film 21, a function layer 24G including a green light-emitting layer as a layer above the first electrode 22, and the second electrode 25 as a layer above the function layer 24G. The light-emitting element XB that emits blue color includes the first electrode 22 as a layer above the interlayer insulating film 21, a function layer 24B including a blue light-emitting layer as a layer above the first electrode 22, and the second electrode 25 as a layer above the function layer 24B.

An edge cover 23 covering the edge of the first electrode 22 is formed on the interlayer insulating film 21.

Since a subpixel SP displaying the red color includes the light-emitting element XR, the subpixel SP includes the function layer 24R including the red light-emitting layer, since a subpixel SP displaying the green color includes the light-emitting element XG, the subpixel SP includes the function layer 24G including the green light-emitting layer, and since the subpixel SP displaying the blue color includes the light-emitting element XB, the subpixel SP includes the function layer 24B including the blue light-emitting layer.

In the display device 1, each subpixel SP includes the first electrode 22 having an island shape, the function layers 24R, 24G, and 24B each including the light-emitting layer of corresponding one of colors, and the second electrode 25. The edge cover 23 may be formed of, for example, a coatable photosensitive organic material such as a polyimide resin or an acrylic resin.

The function layers 24R, 24G, and 24B are formed by layering, in the order from the lower layer side, a hole injection layer, a hole transport layer, a light-emitting layer, an electron transport layer, and an electron injection layer, for example. The light-emitting layer is formed in an island shape for each subpixel SP by a vapor deposition method or an ink-jet method, but the other layers can also be configured as solid-like common layers. In addition, a configuration is also possible in which one or more of the hole injection layer, hole transport layer, electron transport layer, and electron injection layer are not formed.

The light-emitting elements XR, XG, and XB each may be, for example, an organic light-emitting diode (OLED) including an organic layer as the light-emitting layer, or may be a quantum dot light-emitting diode (QLED) including a quantum dot layer as the light-emitting layer.

The first electrode 22 is formed by, for example, layering Indium Tin Oxide (ITO) and an alloy including silver (Ag). However, the composition is not particularly limited, and it is only required that electrical conductivity and light reflectivity can be ensured. Also, the second electrode 25 can be formed by a light-transmitting conductive material such as Indium Tin Oxide (ITO) and Indium Zinc Oxide (IZO). However, the composition is not particularly limited, and it is only required that electrical conductivity and light-transmitting properties can be ensured.

The first electrode 22 is provided for each subpixel SP, and is electrically connected to the drain electrode of the second initialization transistor T7. In addition, the second electrode 25 is a common electrode provided in common with all of the subpixels SP. The second initialization transistor T7 is driven for each subpixel SP. Note that the second electrode 25 serving as the common electrode provided in common with all of the subpixels SP is electrically connected to the trunk wiring line ELVSSM of the ELVSS voltage line via a metal layer CDL1 illustrated in FIG. 1.

The sealing layer 6 is a light transmissive layer, and includes a first inorganic sealing film 26 that covers the second electrode 25, an organic sealing film 27 that is formed on a side above the first inorganic sealing film 26, and a second inorganic sealing film 28 that covers the organic sealing film 27. The sealing layer 6 covering the light-emitting elements XR, XG, and XB inhibits foreign matters such as water and oxygen from penetrating into the light-emitting elements XR, XG, and XB.

Each of the first inorganic sealing film 26 and the second inorganic sealing film 28 may be constituted by, for example, a silicon oxide film, a silicon nitride film, or a silicon oxynitride film, or a layered film of these films formed by CVD. The organic sealing film 27 is a light transmissive organic film which is thicker than the first inorganic sealing film 26 and the second inorganic sealing film 28, and can be formed of a coatable photosensitive organic material such as a polyimide resin or an acrylic resin.

In the present embodiment, the sealing layer 6 constituted by a single-layered organic film and a two-layered inorganic film and including the organic sealing film 27 between the first inorganic sealing film 26 and the second inorganic sealing film 28 has been described as an example, but the embodiment is not limited thereto. The sealing layer 6 may be formed of only an inorganic film constituted by one or more layers or an organic film constituted by one or more layers, or may be formed of an inorganic film constituted by two or more layers or an organic film constituted by two or more layers.

In the present embodiment, a description will be given using, as an example, a case in which the display device 1 is a flexible display device, and the base substrate 10 serving as a flexible substrate is bonded to the resin layer 12 via the adhesive layer 11, but the configuration is not limited thereto. For example, the process of bonding the base substrate 10 serving as the flexible substrate, via the adhesive layer 11, may be omitted, and the resin layer 12 as is may be used as the flexible substrate. In addition, the display device 1 may be a non-flexible display device, and in this case, for example, the base substrate 10, the adhesive layer 11, and the resin layer 12 may be omitted, and the barrier layer 3 may be formed directly on a glass substrate serving as the non-flexible substrate.

As illustrated in FIG. 5, the display region DA of the display device 1 includes a plurality of light-emitting elements XR, XG, and XB, a plurality of transistors such as the second initialization transistor T7, and a plurality of capacitance elements, and the plurality of light-emitting elements XR, XG, and XB are driven by a pixel circuit PK (see FIG. 3) including the plurality of transistors, such as the second initialization transistor T7 and the plurality of capacitance elements formed in a lower layer than the plurality of light-emitting elements XR, XG, and XB.

As described above, each of the plurality of light-emitting elements XR, XG, and XB includes the second electrode 25 serving as the upper layer and the first electrode 22 serving as the lower layer. Since the second electrode 25 serving as the common electrode needs to be electrically connected to the trunk wiring line ELVSSM of the ELVSS voltage line illustrated in FIG. 1, the second electrode 25 is formed to the entirety of the display region DA and a part of the frame region NDA, and is in direct contact with the metal layer CDL1 formed of the same layer and the same material as the first electrode 22 in the frame region NDA, and thus the second electrode 25 and the metal layer CDL1 are electrically connected to each other. The metal layer CDL1 is also in direct contact with the trunk wiring line ELVSSM of the ELVSS voltage line, and the second electrode 25 serving as the common electrode is electrically connected to the trunk wiring line ELVSSM of the ELVSS voltage line via the metal layer CDL1. In addition, as in a portion R indicated by a dotted line in which a part of the metal layer CDL1 is enlarged as illustrated in FIG. 1, the metal layer CDL1 includes a plurality of openings KA. Note that the plurality of openings KA may be provided in the entirety of the metal layer CDL1, or may be provided in a part of the metal layer CDL1.

Figure 2:
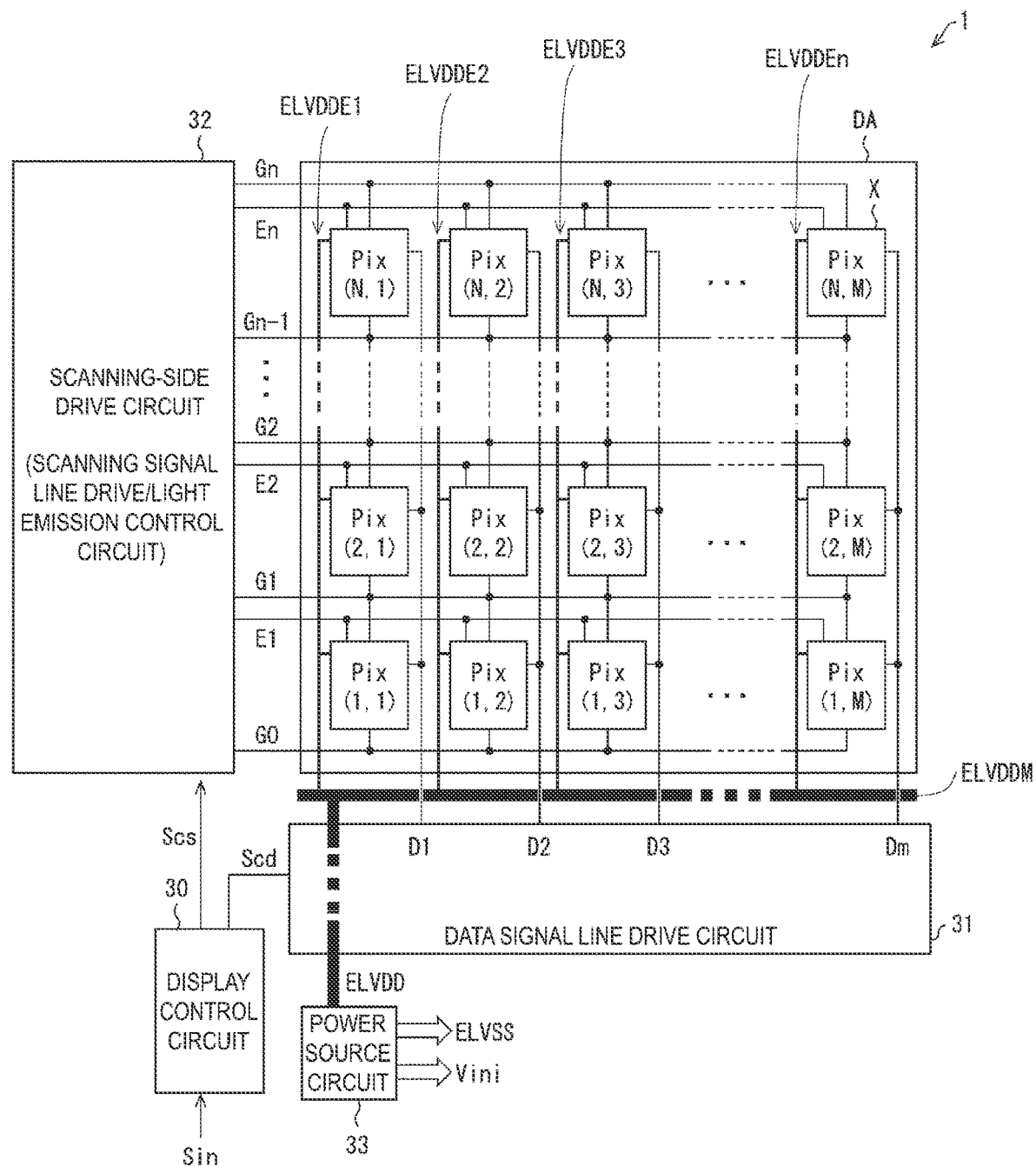
FIG. 2 is a view illustrating a configuration example of a circuit of the display device according to the first embodiment.

FIG. 2 is a view illustrating a configuration example of a circuit of the display device 1 according to the first embodiment.

As illustrated in FIG. 2, the display device 1 includes a display control circuit 30, a data signal line drive circuit 31, a scanning-side drive circuit 32 (including a scanning signal line drive circuit and a light emission control circuit), and a power source circuit 33, as a drive circuit for driving the light-emitting elements X (the light-emitting element XR that emits red color, the light-emitting element XG that emits green color, and the light-emitting element XB that emits blue color) in the display region DA.

The ELVDD voltage line includes the trunk wiring line ELVDDM, a plurality of branch wiring lines ELVDDE1 to ELVDDEn electrically connected to the trunk wiring line ELVDDM, and the two lead wiring lines ELVDDH extending from each of the terminal TP2 and the terminal TPn−1 (illustrated in FIG. 1) of the terminal portion TER and electrically connected to the trunk wiring line ELVDDM (illustrated in FIG. 1).

Note that, in the present embodiment, a description will be given using, as an example, a case in which the two lead wiring lines ELVDDH and the two lead wiring lines ELVSSH are provided, but the embodiment is not limited thereto, and one or three or more lead wiring lines ELVDDH and one or three or more lead wiring lines ELVSSH may be provided.

Various signals Sin including an image signal are supplied from the outside to the display control circuit 30, a signal Scd for controlling data signal lines D1 to Dm is supplied from the display control circuit 30 to the data signal line drive circuit 31, a clock signal Scs is supplied from the display control circuit 30 to the scanning-side drive circuit 32, the scanning signal line drive circuit supplies a scanning signal to the scanning signal lines G0 to Gn, and the light emission control circuit supplies a light emission signal to the light emission control lines E1 to En.

The power source circuit 33 supplies the ELVDD voltage to the trunk wiring line ELVDDM via the terminal TP2 and the terminal TPn−1 of the terminal portion TER and the lead wiring line ELVDDH extending from each of the terminal TP2 and the terminal TPn−1 of the terminal portion TER illustrated in FIG. 1. Then, the ELVDD voltage is also supplied to each of the plurality of branch wiring lines ELVDDE1 to ELVDDEn via the trunk wiring line ELVDDM. The power source circuit 33 supplies the ELVSS voltage to the trunk wiring line ELVSSM (illustrated in FIG. 1) via the terminal TP1 and the terminal TPn of the terminal portion TER and the lead wiring line ELVSSH extending from each of the terminal TP1 and the terminal TPn of the terminal portion TER illustrated in FIG. 1. Further, the power source circuit 33 also supplies an initialization voltage to the second initialization power source line Ini (see FIG. 3).

As illustrated in FIG. 2, the display region DA includes N×M light-emitting elements X, each serving as one light-emitting unit Pix. Note that, in the present embodiment, a description will be given using, as an example, a case in which the number of the data signal lines D1 to Dm, the number of the branch wiring lines ELVDDE1 to ELVDDEn, and the number of columns M of the light-emitting elements X, each serving as the one light-emitting unit Pix are the same, but the configuration is not limited thereto. In addition, in the present embodiment, a description will be given using, as an example, a case in which the number of the light emission control lines E1 to En and the number of rows N of the light-emitting elements X, each serving as the one light-emitting unit Pix are the same, and the number of the scanning signal lines G0 to Gn is greater by one than the number of light emission control lines E1 to En and the number of rows N of the light-emitting elements X, each serving as the one light-emitting unit Pix.

Note that, in the display device 1, the data signal line drive circuit 31 is externally attached, and each terminal of the data signal line drive circuit 31 is electrically connected to corresponding one of terminals other than the terminals TP1, TP2, TPn−1, and TPn of the terminal portion TER.

In the display device 1, the scanning-side drive circuit 32 is monolithically formed in the frame region NDA, but the embodiment is not limited thereto, the scanning-side drive circuit 32 may be monolithically formed in the display region DA, and may be monolithically formed in the frame region NDA and the display region DA in a distributed manner.

Figure 3:
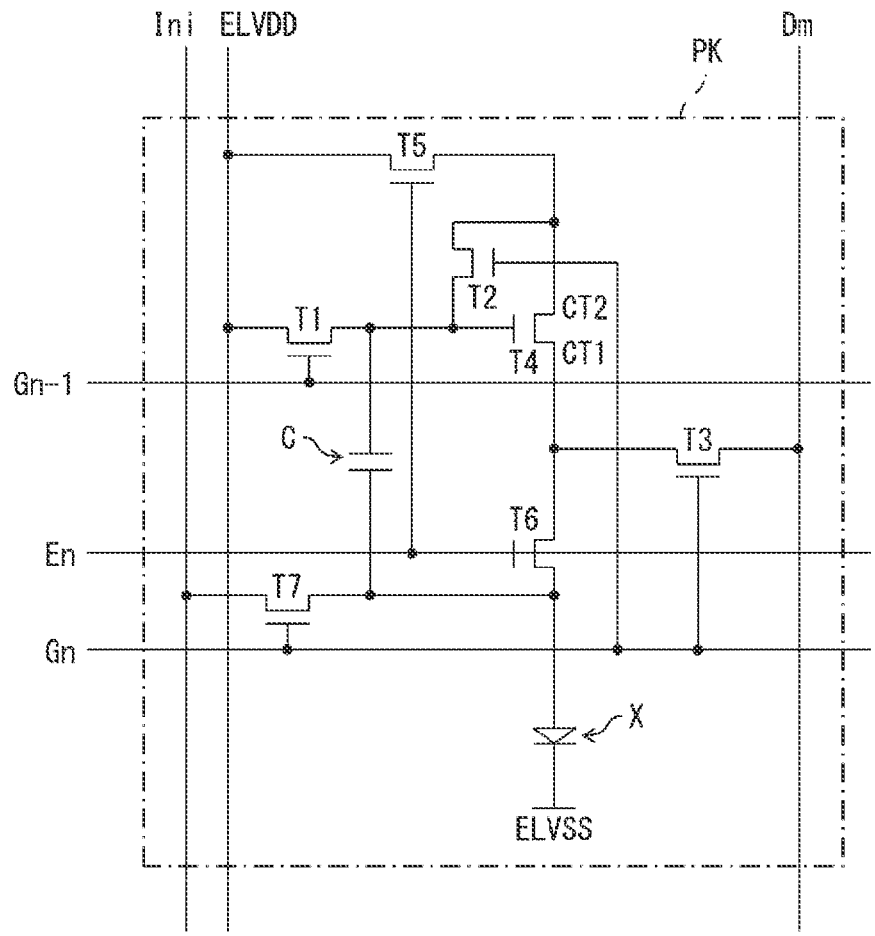
FIG. 3 is a view illustrating a configuration example of a pixel circuit of the display device according to the first embodiment illustrated in FIG. 1.

FIG. 3 is a circuit view illustrating an example of the pixel circuit PK of the display device 1 illustrated in FIG. 1.

In the display region DA illustrated in FIG. 1, the light-emitting elements X and their pixel circuit PK are provided for each subpixel serving as the one light-emitting unit, and the pixel circuit PK illustrated in FIG. 3 indicates the pixel circuit PK in the n-th row and the m-th column, but also includes a part of a pixel circuit in the (n−1)-th row and the m-th column.

The pixel circuit PK illustrated in FIG. 3 includes: a capacitance element C; a first initialization transistor T1 connected between the ELVDD voltage line ELVDD (specifically, the branch wiring line ELVDDEn) and a control terminal of a drive transistor T4 and having a gate terminal connected to a scanning signal line Gn−1 of a preceding stage ((n−1)-th stage); a threshold control transistor T2 connected between a second conductive terminal CT2 and the control terminal of the drive transistor T4 and having a gate terminal connected to a scanning signal line Gn of an own stage (n-th stage); a writing control transistor T3 connected between a data signal line Dm and a first conductive terminal CT1 of the drive transistor T4 and having a gate terminal connected to the scanning signal line Gn) of the own stage (n-th stage); the drive transistor T4 configured to control a current of the light-emitting elements X; a power source transistor T5 connected between the ELVDD voltage line ELVDD (specifically, the branch wiring line ELVDDEn) and the second conductive terminal CT2 of the drive transistor T4 and having a gate terminal connected to a light emission control line En; a light emission control transistor T6 connected between the first conductive terminal CT1 of the drive transistor T4 and the first electrode of the light-emitting elements X and having a gate terminal connected to the light emission control line En; and a second initialization transistor T7 connected between a second initialization power source line Ini and the first electrode of the light-emitting elements X and having a gate terminal connected to the scanning signal line Gn of the own stage (n-th stage).

Note that in the present embodiment, a description will be given using, as an example, a case in which the ELVDD voltage line ELVDD (specifically, the branch wiring line ELVDDEn) serves as a first initialization power source line, but the configuration is not limited thereto, and the first initialization power source line and the ELVDD voltage line ELVDD (specifically, the branch wiring line ELVDDEn) may be provided separately.

Further, in the present embodiment, a voltage identical to the ELVSS voltage line ELVSS may be input to the second initialization power source line Ini, but this is not a limitation, and a different voltage, with which the light-emitting elements X is turned off, may be input thereto.

The capacitance element C is connected to the control terminal of the drive transistor T4, and holds a data signal in the data signal line Dm. Note that the second initialization transistor T7 may be connected to the scanning signal line Gn−1 of the preceding stage ((n−1)-th stage).

Figure 4:
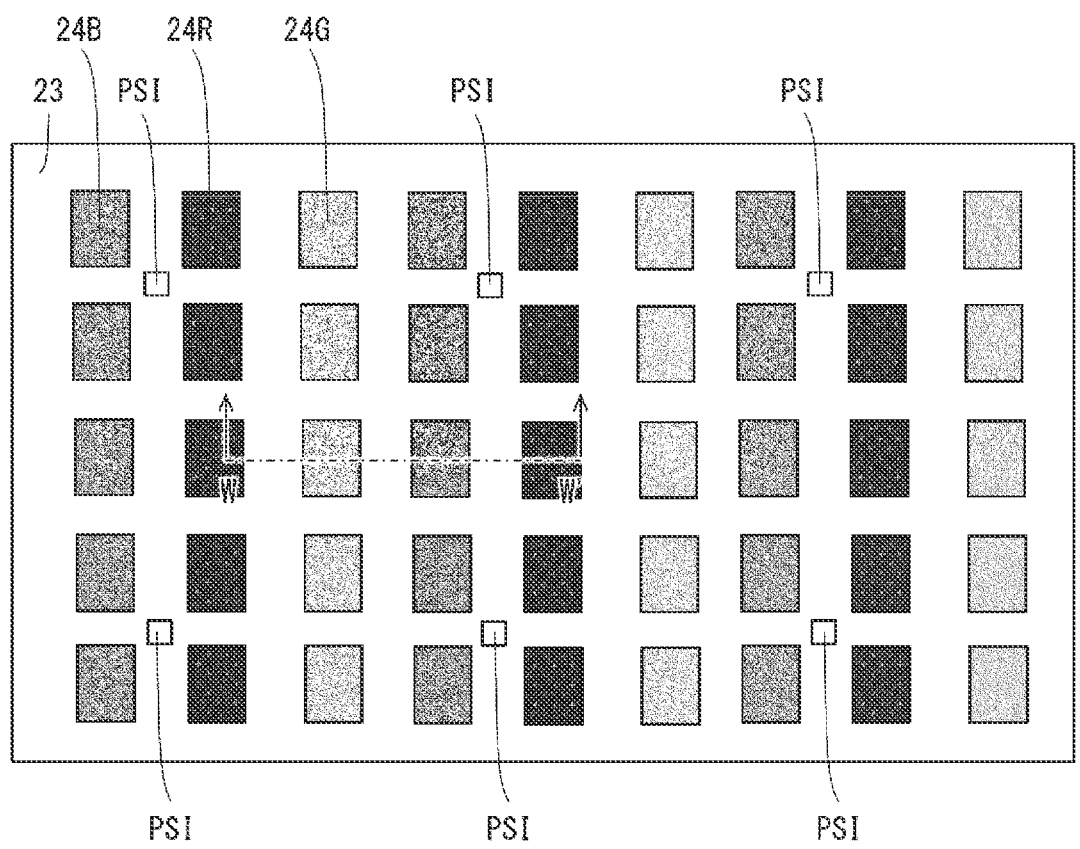
FIG. 4 is a plan view illustrating a part of a display region of the display device according to the first embodiment.

FIG. 4 is a plan view illustrating a part of the display region DA of the display device 1 according to the first embodiment.

As illustrated in FIG. 4, the display region DA of the display device 1 includes a first spacer PSI between the plurality of light-emitting elements XR, XG, and XB each including corresponding one of function layers 24R, 24G, and 24B. Note that as long as the first spacer PSI is disposed between the light-emitting elements XR, XG, and XB, the number and the arrangement positions of the first spacer PSI is not particularly limited.

The first spacer PSI may be formed of the same material as that of the above-described edge cover 23, and, can be formed of, for example, a coatable photosensitive organic material such as a polyimide resin or an acrylic resin.

In addition, in a case where the first spacer PSI and the edge cover 23 are formed using the same material, the first spacer PSI and the edge cover 23 may be formed simultaneously by one exposure and development process.

Figure 6:
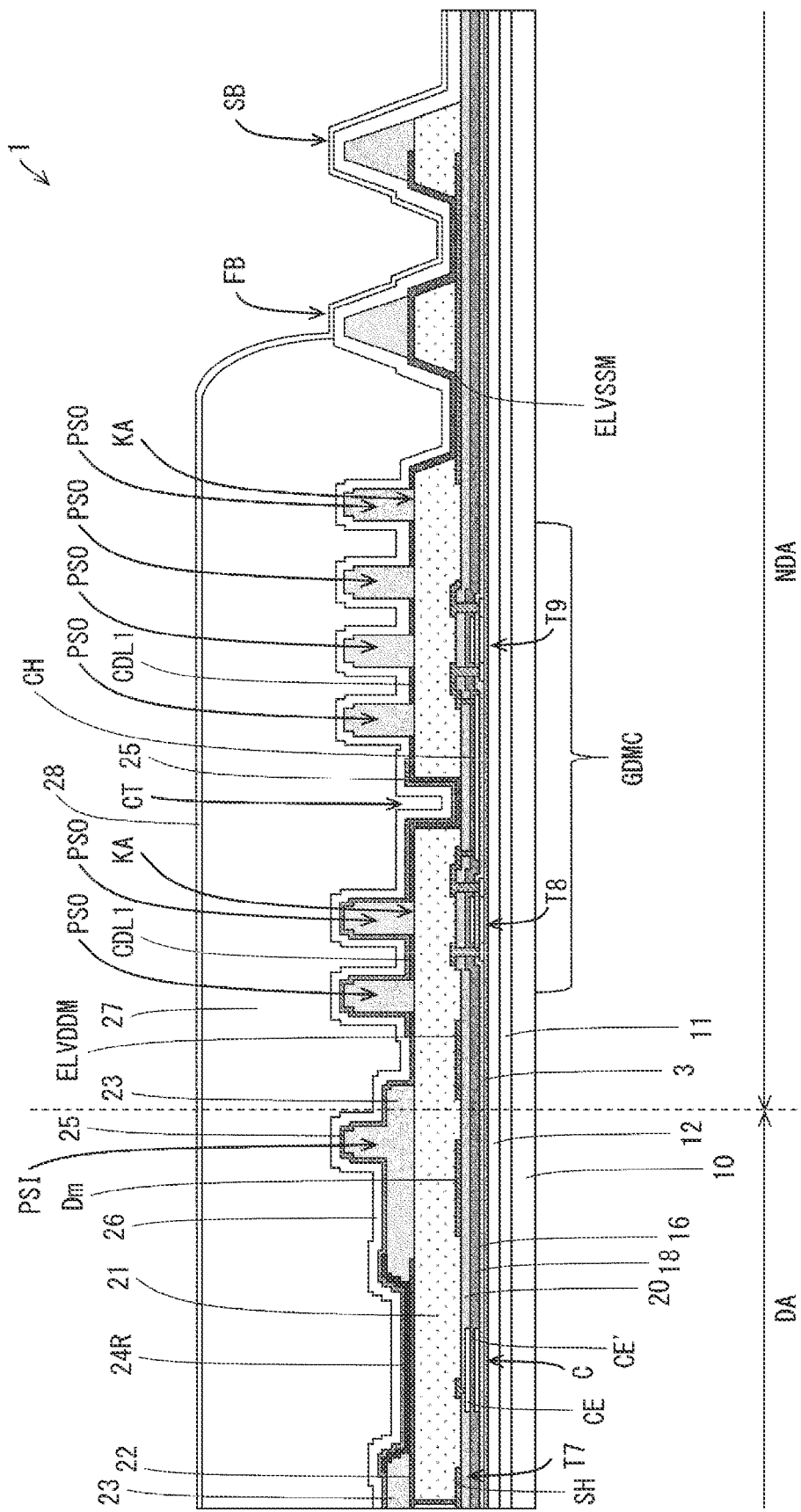
FIG. 6 is a cross-sectional view illustrating the display device according to the first embodiment illustrated in FIG. 1.

FIG. 6 is a cross-sectional view illustrating a part of the display device 1 according to the first embodiment illustrated in FIG. 1.

As illustrated in FIG. 6, each of the data signal line Dm in the display region DA, the trunk wiring line ELVDDM in the frame region NDA, and the trunk wiring line ELVSSM in the frame region NDA is formed of the layer SH forming the source electrode, the drain electrode of the second initialization transistor T7, and the wiring line of the electrodes.

The second electrode 25 serving as the common electrode is formed to the outside of a trench CT provided in the frame region NDA. In this way, the second electrode 25 provided in the frame region NDA, in other words, an extending portion of the second electrode 25 is electrically connected to the metal layer CDL1 formed of the same layer and the same material as the first electrode 22 at a region between the trench CT and the display region DA and at the trench CT. The second electrode 25 serving as the common electrode is electrically connected to the trunk wiring line ELVSSM of the ELVSS voltage line via the metal layer CDL1 on the inner side of a second bank SB formed farther from the display region DA than a first bank FB.

A material of the second electrode 25 and the extending portion of the second electrode 25 is not particularly limited as long as conductivity and light-transmissive property can be ensured, and for example, a material such as silver, silver alloy (AgMg, or the like), or aluminum formed to have a film thickness sufficient to ensure light-transmissive property can be used.

The trench CT is a groove formed so as to surround the display region DA in the frame-like shape, and the first bank FB and the second bank SB are projections formed so as to surround the display region DA in the frame-like shape.

As illustrated in FIG. 6, a description will be given using, as an example, a case in which in the display device 1, the metal layer CDL1 extends from the region between the trench CT and the display region DA to a region overlapping the second bank SB in the frame region NDA, but the configuration is not limited thereto, and the metal layer CDL1 may be formed in the frame region NDA. Note that, in the present embodiment, a description will be given using, as an example, a case in which an electrode pad (not illustrated) provided between the trench CT and the display region DA overlaps the opening KA of the metal layer CDL1 provided between the trench CT and the display region DA, and an electrode pad (not illustrated) provided between the trench CT and the bank (the first bank FB or the second bank SB) overlaps the opening KA of the metal layer CDL1 provided between the trench CT and the bank (the first bank FB or the second bank SB), but the configuration is not limited thereto.

As illustrated in FIG. 6, the second electrode 25 is provided on the metal layer CDL1 provided between the display region DA and the trench CT and the opening KA of the metal layer CDL1, and the electrode pad (not illustrated) provided between the display region DA and the trench CT overlaps the opening KA provided between the display region DA and the trench CT and the extending portion of the second electrode 25 provided between the display region DA and the trench CT. However, as described above, since the extending portion of the second electrode 25 is light-transmissive, when performing analysis or inspection of the display device 1, position confirmation of the electrode pads can be easily performed.

As illustrated in FIG. 6, a control circuit formation region GDMC in which various transistors including a control transistor T8 and a control transistor T9 are monolithically formed is present between the trunk wiring line ELVDDM and the trunk wiring line ELVSSM.

Note that the control transistor T8 and the control transistor T9 are electrically connected to each other by a connection wiring line CH, and constitute a part of the scanning-side drive circuit 32 (illustrated in FIG. 2). The control transistor T8 and the control transistor T9 are examples, and each of the control transistor T8 and the control transistor T9 includes a plurality of control transistors. In the present embodiment, a description will be given using, as an example, a case in which the scanning signal line drive circuit is provided closer to the display region DA side than the trench CT, in other words, closer to the control transistor T8 side, and the light emission control circuit is provided closer to the opposite side of the control transistor T8 side, in other words, closer to the control transistor T9 side, but the configuration is not limited thereto.

As illustrated in FIG. 6, the capacitance element C included in the pixel circuit in the display region DA includes the counter electrode CE formed directly above the inorganic insulating film 18, the inorganic insulating film 18, and a capacitance electrode CE' formed directly below the inorganic insulating film 18 and formed overlapping the counter electrode CE of a capacitance element in the same layer as the layer that forms the gate electrode GE.

In addition, the frame region NDA is provided with a second spacer PSO overlapping the opening KA of the metal layer CDL1. Similar to the first spacer PSI, the second spacer PSO may be formed of the same material as that of the above-described edge cover 23, and, can be formed of, for example, a coatable photosensitive organic material such as a polyimide resin or an acrylic resin.

In addition, in a case where the first spacer PSI, the second spacer PSO, and the edge cover 23 are formed using the same material, the first spacer PSI, the second spacer PSO, and the edge cover 23 may be formed simultaneously by one exposure and development process.

Note that the first spacer PSI and the second spacer PSO described above support, for example, a vapor deposition mask used when depositing the light-emitting layer of each color included in corresponding one of the function layers 24R, 24G, and 24B.

Figure 7:
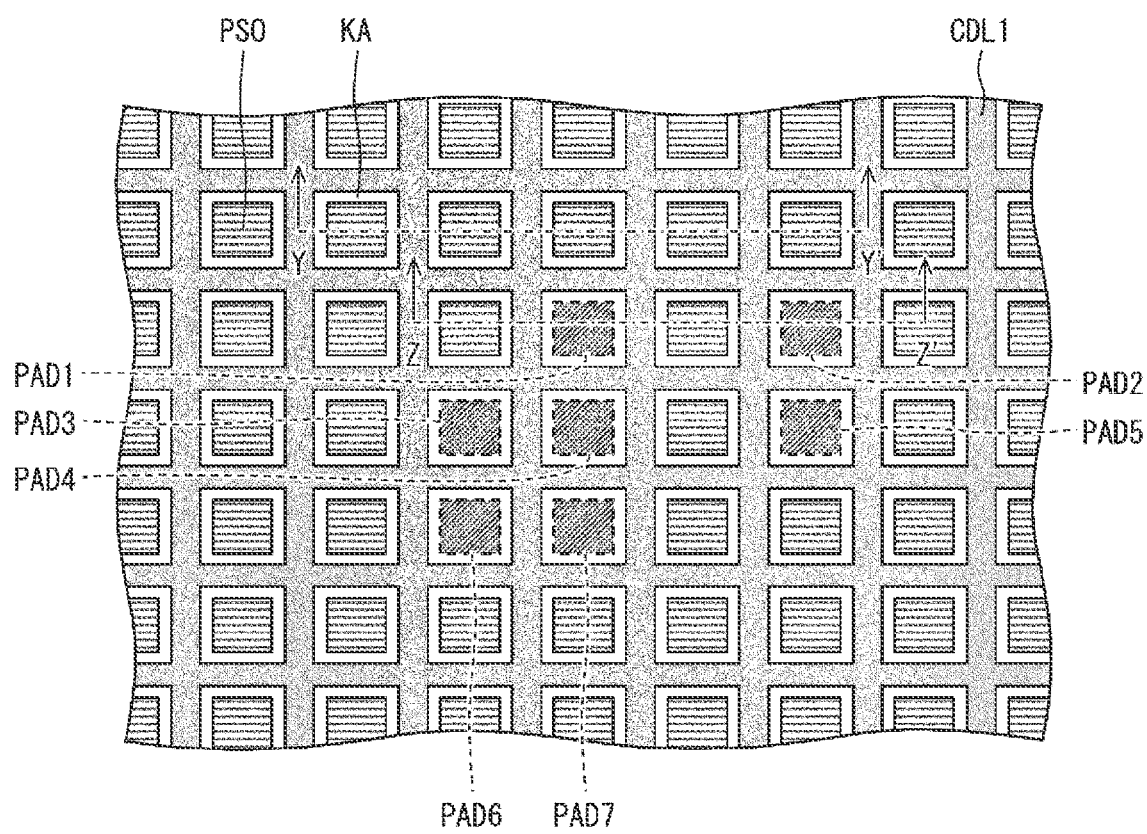
FIG. 7 is a plan view illustrating a metal layer provided in the display device according to the first embodiment.

FIG. 7 is a plan view illustrating the metal layer CDL1 provided in the display device 1 according to the first embodiment.

Note that FIG. 7 does not illustrate the sealing layer 6 including the first inorganic sealing film 26, the organic sealing film 27 and the second inorganic sealing film 28 illustrated in FIGS. 5 and 6 formed so as to cover the metal layer CDL1, the second spacer PSO, and the interlayer insulating film 21.

As illustrated in FIG. 7, the metal layer CDL1 includes a plurality of openings KA. For example, electrode pads PAD1 to PAD7 for analysis or inspection may be formed in the display device 1 having such a configuration.

Each of the electrode pads PAD1 to PAD7 having the island shape provided in the frame region NDA is provided so as to overlap corresponding one of the plurality of openings KA of the metal layer CDL1. In the present embodiment, a description will be given using, as an example, a case in which each of the electrode pads PAD1 to PAD7 having the island shape is formed smaller than corresponding one of the plurality of openings KA of the metal layer CDL1, and one of the electrode pads PAD1 to PAD7 having the island shape corresponds to one of the openings KA of the metal layer CDL1, but the configuration is not limited thereto, and each of the electrode pads PAD1 to PAD7 having the island shape is formed larger than corresponding one of the plurality of openings KA of the metal layer CDL1, and one of the electrode pads PAD1 to PAD7 having the island shape corresponds to two or more of the plurality of openings KA of the metal layer CDL1.

Note that, as illustrated in FIG. 7, the second spacer PSO is provided in the opening KA not overlapping the electrode pads PAD1 to PAD7 having the island shape among the plurality of openings KA of the metal layer CDL1. On the other hand, the second spacer PSO is not provided in the opening KA overlapping one of the electrode pads PAD1 to PAD7 having the island shape among the plurality of openings KA of the metal layer CDL1. In other words, the opening KA overlapping one of the electrode pads PAD1 to PAD7 does not overlap the second spacer PSO.

Figure 8:
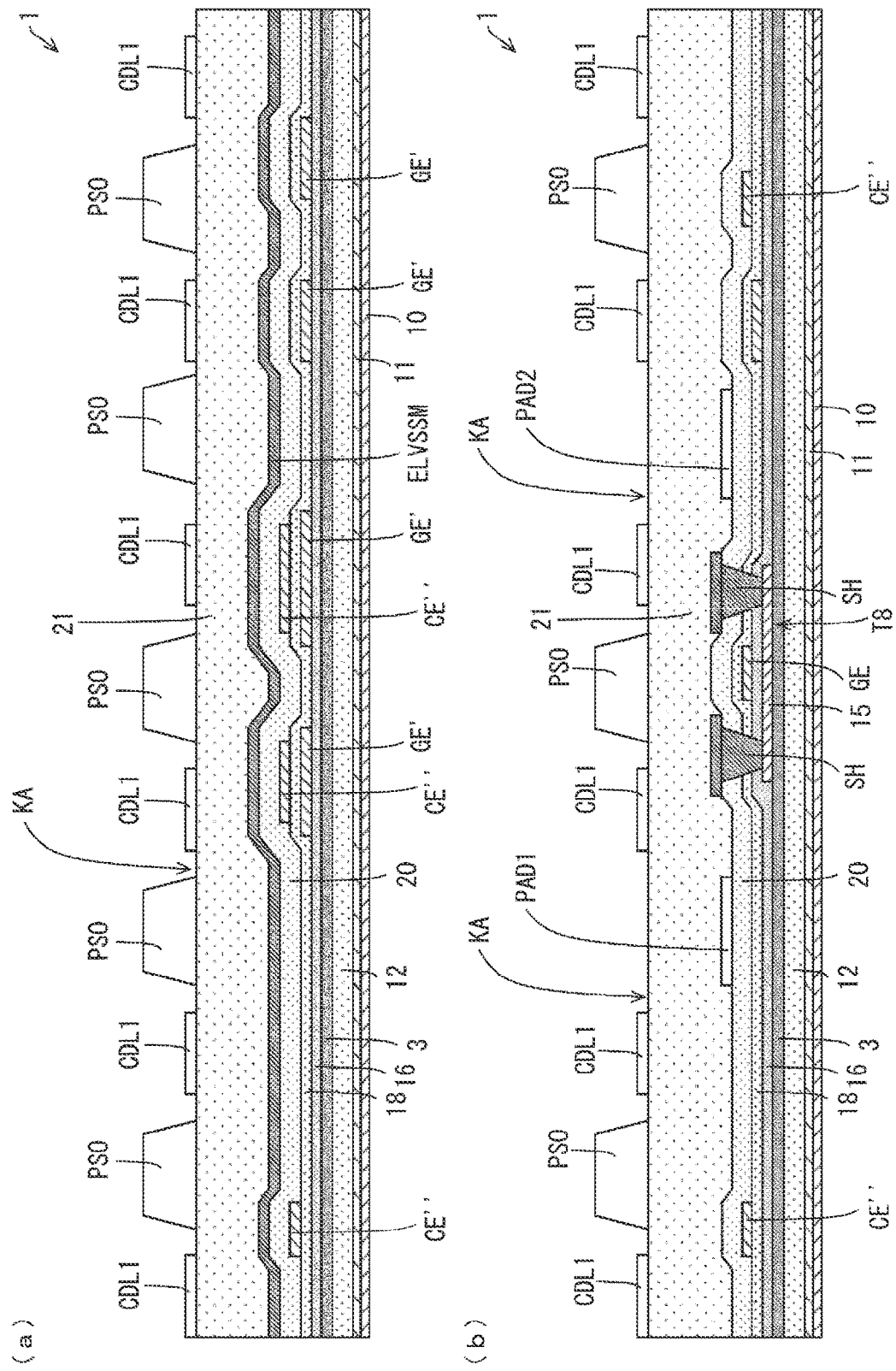
FIG. 8(*a*) is a cross-sectional view taken along a line Y-Y' of the metal layer provided in the display device according to the first embodiment illustrated in FIG. 7, and FIG. 8(*b*) is a cross-sectional view taken along a line Z-Z' of the metal layer provided in the display device according to the first embodiment illustrated in FIG. 7.

(a) of FIG. 8 is a cross-sectional view taken along a line Y-Y' of the metal layer CDL1 provided in the display device 1 according to the first embodiment illustrated in FIG. 7, and (b) of FIG. 8 is a cross-sectional view taken along a line Z-Z' of a metal layer CDL1 provided in the display device 1 according to the first embodiment illustrated in FIG. 7.

Note that (a) of FIG. 8 and (b) of FIG. 8 do not illustrate the sealing layer 6 including the first inorganic sealing film 26, the organic sealing film 27 and the second inorganic sealing film 28 illustrated in FIGS. 5 and 6 formed so as to cover the metal layer CDL1, the second spacer PSO, and the interlayer insulating film 21.

As illustrated in (a) of FIG. 8, the second spacer PSO is provided in the opening KA not overlapping the electrode pads PAD1 to PAD7 having the island shape among the plurality of openings KA of the metal layer CDL1. On the other hand, as illustrated in (b) of FIG. 8, the second spacer PSO is not provided in the opening KA overlapping, for example, the electrode pads PAD1 and PAD2 having the island shape among the plurality of openings KA of the metal layer CDL1. In other words, the opening KA overlapping the electrode pads PAD1 and PAD2 does not overlap the second spacer PSO.

Note that the layer CE" forming the electrodes and wiring lines in (a) of FIG. 8 and (b) of FIG. 8 is a layer formed of the same layer and the same material as the counter electrode CE (see FIGS. 5 and 6) formed directly above the inorganic insulating film 18, and the layer GE' forming the electrodes and the wiring lines is a layer formed of the same layer and the same material as the gate electrode GE (see FIG. 5) formed directly above the inorganic insulating film 16.

The layer CE" forming the electrodes and wiring lines and the layer GE' forming the electrodes and the wiring lines illustrated in (a) of FIG. 8 and (b) of FIG. 8 are control circuits, wiring lines, and the like monolithically formed in the frame region NDA of the display device 1.

Figure 9:
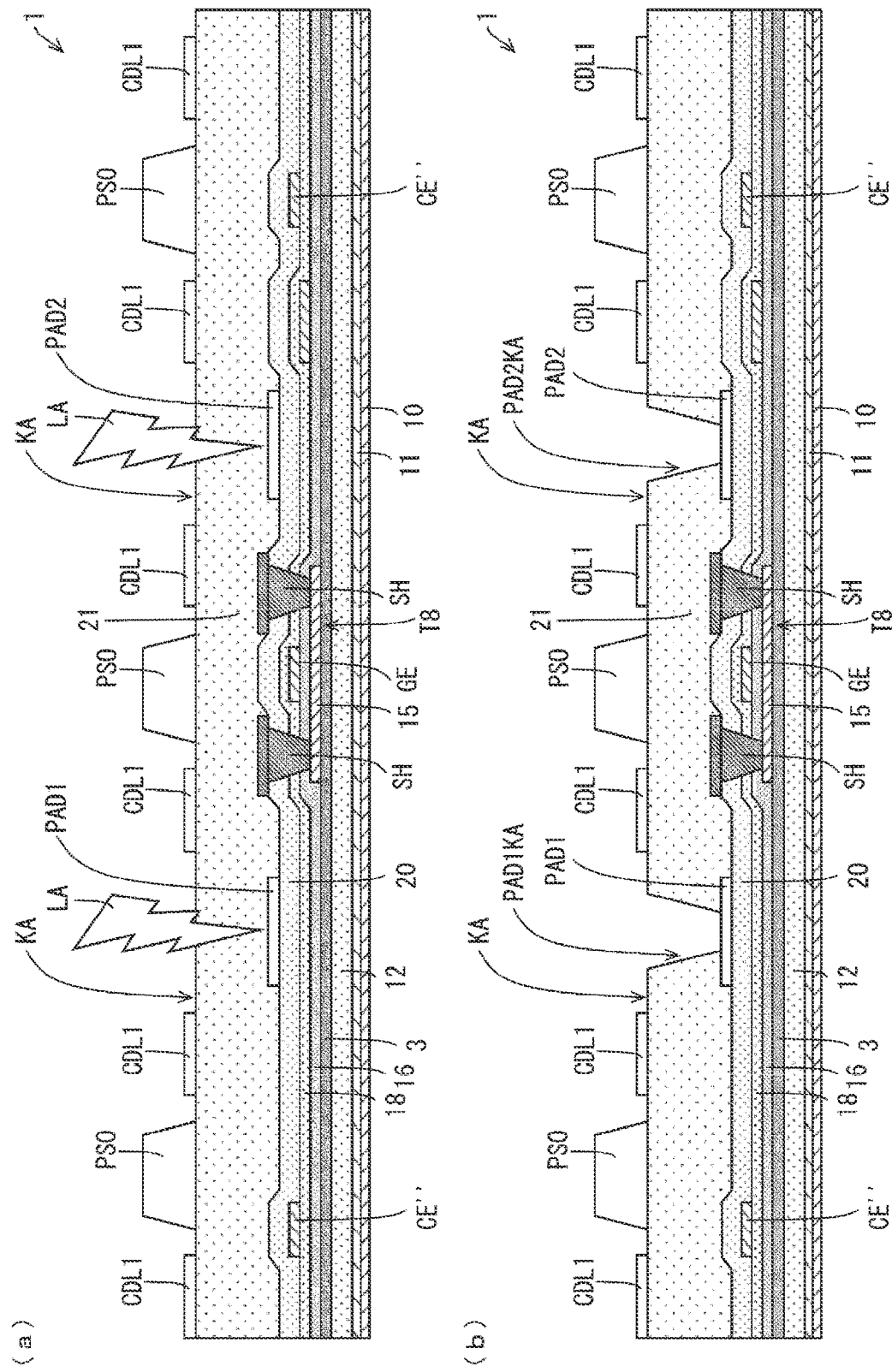
FIGS. 9(*a*) and (*b*) are views for explaining a step of removing an interlayer insulating film via an opening of a metal layer provided in the display device according to the first embodiment to expose electrode pads.

(a) of FIG. 9 and (b) of FIG. 9 are views illustrating the method for inspecting the display device 1, including a first step of confirming the position of the electrode pads PAD1 and PAD2 via the openings KA of the metal layer CDL1 provided in the display device 1 according to the first embodiment, and a second step of removing the interlayer insulating film 21 via the openings KA of the metal layer CDL1 to expose the electrode pads PAD1 and PAD2.

Note that the arrangement positions of the electrode pads PAD1 and PAD2 illustrated in (a) of FIG. 9 and (b) of FIG. 9 may be provided closer to the display region DA side of the trench in the frame region NDA, and may be provided on the opposite side of the display region DA side of the trench in the frame region NDA. For example, in a case where the electrode pads PAD1 and PAD2 are provided closer to the display region DA side of the trench, since the scanning signal line drive circuit is formed closer to the display region DA side of the trench in the present embodiment as described above, nodes of the scanning signal line drive circuit can be directly measured using the electrode pads PAD1 and PAD2 provided closer to the display region DA side of the trench. On the other hand, for example, in a case where the electrode pads PAD1 and PAD2 are provided on the opposite side of the display region DA side of the trench, since the light emission control circuit is formed on the opposite side of the display region DA side of the trench in the present embodiment as described above, nodes of the light emission control circuit can be directly measured using the electrode pads PAD1 and PAD2 provided on the opposite side of the display region DA side of the trench. However, since the extending portion of the second electrode 25 is formed closer to the display region DA side of the trench as illustrated in FIG. 6, and the second electrode 25 needs to be removed for measurement using the electrode pads PAD1 and PAD2 provided closer to the display region DA side of the trench. the electrode pads PAD1 and PAD2 are preferably provided in a region where the extending portion of the second electrode 25 is not formed, in other words, on the opposite side of the display region DA side of the trench. In a case where the electrode pads PAD1 and PAD2 are provided on the opposite side of the display region DA side of the trench in this way, the node to be measured in the pixel circuit PK, the scanning signal line drive circuit, or the like is connected to the electrode pads PAD1 and PAD2 provided on the opposite side of the display region DA side of the trench via the lead wiring line, and thus the potential and the like of the corresponding node can be measured. Note that, since the light emission control circuit is provided on the opposite side of the display region DA side of the trench, the node of the light emission control circuit can also be directly measured by using the node of the light emission control circuit as the electrode pads PAD1 and PAD2 without using the lead wiring line. In the present embodiment, the description has been given using, as the example, the case in which the scanning signal line drive circuit is the display region DA side of the trench, but the method is not limited thereto, and the scanning signal line drive circuit may be provided on the opposite side of the display region DA side of the trench, and in such a case, the node of the scanning signal line drive circuit can also be directly measured by using the node of the scanning signal line drive circuit as the electrode pads PAD1 and PAD2 without using the lead wiring line.

Note that (a) of FIG. 9 and (b) of FIG. 9 do not illustrate the sealing layer 6 including the first inorganic sealing film 26, the organic sealing film 27 and the second inorganic sealing film 28 illustrated in FIGS. 5 and 6 formed so as to cover the metal layer CDL1, the second spacer PSO, and the interlayer insulating film 21.

As illustrated in (a) of FIG. 9 and (b) of FIG. 9, the second spacer PSO is not provided in the opening KA overlapping, for example, the electrode pads PAD1 and PAD2 having the island shape among the plurality of openings KA of the metal layer CDL1. In other words, the opening KA overlapping the electrode pads PAD1 and PAD2 does not overlap the second spacer PSO. The openings KA each overlapping such corresponding one of the electrode pads PAD1 and PAD2 having the island shape are irradiated with, for example, a laser to remove the interlayer insulating film 21 and the sealing layer 6 (illustrated in FIG. 5) on the electrode pads PAD1 and PAD2 having the island shape, and thus openings PAD1KA and PAD2KA in the interlayer insulating film 21 and the sealing layer 6 (illustrated in FIG. 5) each on a corresponding one of the electrode pads PAD1 and PAD2 having the island shape can be formed.

As described above, the method for inspecting the display device 1 illustrated in (a) of FIG. 9 and (b) of FIG. 9 includes a step of removing the interlayer insulating film 21 via the openings KA of the metal layer CDL1 in a portion where the electrode pads PAD1 and PAD2, the interlayer insulating film 21, the openings KA of the metal layer CDL1, and the sealing layer 6 (illustrated in FIG. 5) overlap each other to expose electrode pads PAD1 and PAD2.

In the present embodiment, a description will be given using, as an example, a case in which the laser is used for removing the sealing layer 6 (illustrated in FIG. 5) and the interlayer insulating film 21, but the method is not limited thereto, and the sealing layer 6 (illustrated in FIG. 5) and the interlayer insulating film 21 may be removed by, for example, poking with a needle or the like.

As described above, in the display device 1 according to the first embodiment, since the electrode pads PAD1 and PAD2 overlap the corresponding one of the openings KA of the metal layer CDL1 via the interlayer insulating film 21, and the second spacer PSO is not present, the position confirmation of the electrode pads PAD1 and PAD2 can be easily performed, and when performing analysis or inspection of the display device 1, the removal of the metal layer CDL1 is not required.

Note that the sealing layer 6 including the first inorganic sealing film 26, the organic sealing film 27, and the second inorganic sealing film 28 illustrated in FIGS. 5 and 6 is a layer transmitting the lights of the light-emitting elements XR, XG, and XB, and thus does not adversely affect the position confirmation of the electrode pads PAD1 and PAD2.

The method for inspecting the display device 1 according to the first embodiment includes the first step of confirming the position of the electrode pads PAD1 and PAD2 via the openings KA of the metal layer CDL1 in a portion where the electrode pads PAD1 and PAD2, the interlayer insulating film 21, the openings KA of the metal layer CDL1, and the sealing layer 6 (illustrated in FIG. 5) overlap each other, and thus the position confirmation of the electrode pads PAD1 and PAD2 can be easily performed. Further, the method for inspecting the display device 1 according to the first embodiment further includes the second step of removing the interlayer insulating film 21 via the openings KA of the metal layer CDL1 to expose the electrode pads PAD1 and PAD2, and thus when performing analysis or inspection of the display device 1, the removal of the metal layer CDL1 is not required. Note that the electrode pads PAD1 and PAD2 are exposed in order to bring a probe of an analysis device or an inspection device into contact with the exposed electrode pads PAD1 and PAD2.

In the present embodiment, the description has been given using, as the example, the case in which each of the electrode pads PAD1 to PAD7 is formed of the layer SH forming the drain electrodes of the plurality of transistors, such as the second initialization transistor T7 illustrated in FIGS. 5 and 6, and the wiring lines of the electrodes, and the interlayer insulating film (flattening film) 21 is a layer directly above the layer SH forming the drain electrodes of the plurality of transistors such as the second initialization transistor T7 and the wiring line the electrodes, and thus the electrode pads PAD1 to PAD7 are exposed by removing the sealing layer 6 (illustrated in FIG. 5) and the interlayer insulating film (flattening film) 21. The method is not limited thereto, the electrode pads PAD1 to PAD7 may be formed of, for example, the same layer and the same material as the counter electrode CE formed directly below the inorganic insulating film (second inorganic insulating film) 20 illustrated in FIGS. 5 and 6. In this case, the electrode pads PAD1 to PAD7 are exposed by removing the sealing layer 6 (illustrated in FIG. 5), the interlayer insulating film (flattening film) 21, and the inorganic insulating film (second inorganic insulating film) 20. Further, the method is not limited thereto, the electrode pads PAD1 to PAD7 may be formed of, for example, the same layer and the same material as the gate electrode GE formed directly below the inorganic insulating film (first inorganic insulating film) 18 illustrated in FIG. 5. In this case, the electrode pads PAD1 to PAD7 are exposed by removing the sealing layer 6 (illustrated in FIG. 5), the interlayer insulating film (flattening film) 21, the inorganic insulating film (second inorganic insulating film) 20, and the inorganic insulating film (first inorganic insulating film) 18.

Note that in the present embodiment, the description has been given using, as the example, the case in which the sealing layer 6 illustrated in FIG. 5 is also removed to expose the electrode pads PAD1 to PAD7, but the method is not limited thereto, and for example, in a case where the electrode pads PAD1 to PAD7 are exposed when the inspection is necessary before the step of forming the sealing layer 6, in other words, before the display device 1 becomes a finished product, the sealing layer 6 is not required to be removed.

Figure 10:
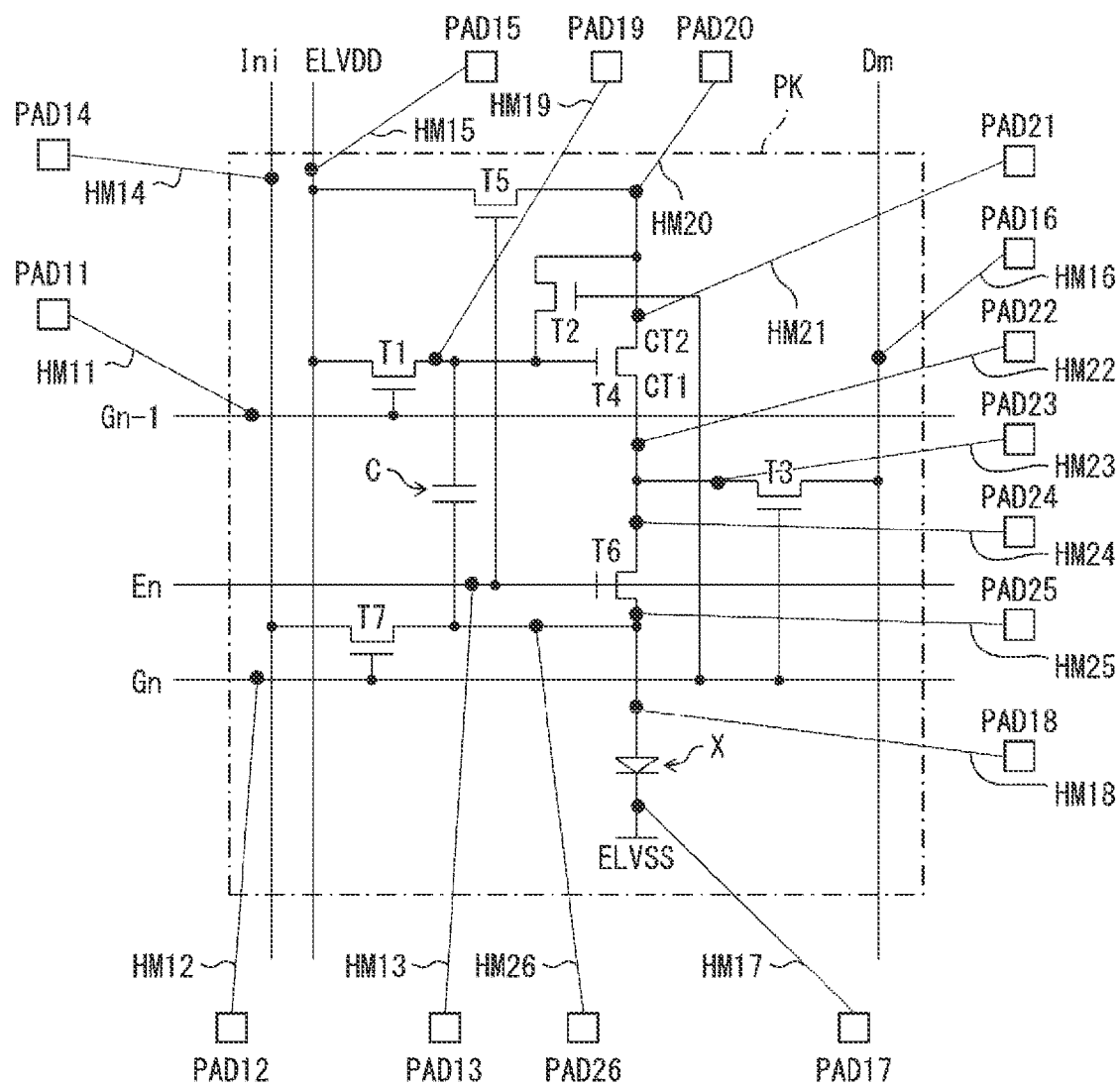
FIG. 10 is a view illustrating an example of points where lead wiring lines electrically connected to the electrode pads are provided in some of the pixel circuits of the display device according to the first embodiment.

FIG. 10 is a view illustrating examples of nodes electrically connectable to a corresponding one of the electrode pads PAD11 to PAD26 via a corresponding one of lead wiring lines HM11 to HM26 in the pixel circuit PK of the display device 1 according to the first embodiment.

As illustrated in FIG. 10, by forming the lead wiring lines HM11 to the HMD 26 from some nodes of the pixel circuit PK of the display device 1, some wiring lines of the pixel circuit PK of the display device 1 can be led to positions where the electrode pads PAD11 to the PAD 26 are present. Thus, some nodes of the pixel circuit PK of the display device 1 can be measured using the electrode pads PAD11 to PAD26. The electrode pads PAD11 and PAD12 electrically connected to the scanning signal lines Gn−1 and Gn, respectively, included in the pixel circuit PK of the display device 1 may be included. In addition, the electrode pads PAD13, PAD14, PAD15, PAD16, and PAD17 electrically connected to the light emission control line En, the second initialization power line Ini, the ELVDD voltage line ELVDD (specifically, branch wiring line ELVDDEn), the data signal line Dm, the ELVSS voltage line ELVSS, respectively, included in the pixel circuit PK of the display device 1 may be included.

The electrode pads PAD18 to PAD26 electrically connected to corresponding one of the nodes of the various transistors T1 to T7, the capacitance element C, and the light-emitting elements X included in the pixel circuit PK of the display device 1 may also be included.

Note that FIG. 10 is the view illustrating an example of the nodes each electrically connectable to the corresponding one of the electrode pads PAD11 to PAD26 via the corresponding one of the lead wiring lines HM11 to HM26 in the pixel circuit PK of the display device 1, and thus the nodes each electrically connectable to the corresponding one of the electrode pads via the corresponding one of the lead wiring lines are not limited thereto.

Note that the arrangement positions of the electrode pads PAD11 to PAD26 illustrated in FIG. 10 may be provided closer to the display region DA side of the trench in the frame region NDA, and may be provided on the opposite side of the display region DA side of the trench in the frame region NDA.

For example, in a case where the electrode pads PAD11 and PAD12 electrically connected to the scanning signal lines Gn−1 and Gn, respectively, are provided closer to the display region DA side of the trench, since the scanning signal line drive circuit is formed closer to the display region DA side of the trench as described above, nodes of the scanning signal line drive circuit can be directly measured using the electrode pads PAD11 and PAD12 provided closer to the display region DA side of the trench. Further, for example, in a case where the electrode pad PAD13 electrically connected to the light emission control line En is provided on the opposite side of the display region DA side of the trench, since the light emission control circuit is formed on the opposite side of the display region DA side of the trench as described above, the node of the light emission control circuit can be directly measured using the electrode pad PAD13 provided on the opposite side of the display region DA side of the trench.

As described above, the display device 1 may include, for example, an electrode pad electrically connected to one node of the scanning-side drive circuit (drive circuit) 32 illustrated in FIG. 2. For example, an electrode pad connected to a first output line (not illustrated) in the scanning-side drive circuit (drive circuit) 32 electrically connected to any of the scanning signal lines G0 to Gn of the pixel circuit PK provided in the display region DA may be provided. Further, an electrode pad connected to a second output line (not illustrated) in the scanning-side drive circuit (drive circuit) 32 electrically connected to any of the light emission control lines E1 to En of the pixel circuit PK provided in the display region DA may be provided.

Thus, in a case where the electrode pads electrically connected to various points of the pixel circuit PK and the scanning-side drive circuit (drive circuit) 32 provided in the display device 1 are provided, analysis or inspection of the display device 1 is further easier.

Note that, in the present embodiment, a description will be given using, as an example, a case in which the plurality of electrode pads are provided in the R1 region, the R2 region, and the R3 region illustrated in FIG. 1 in the frame region NDA of the display device 1 in a distributed manner, but the configuration is not limited thereto, and the regions of the plurality of electrode pads are not particularly limited as long as the plurality of electrode pads are provided in the frame region NDA of the display device 1.

In addition, it is not necessary to measure all the pixel circuits PK provided in the display device 1, and a wiring line may be drawn from some of the pixel circuits PK or a dummy pixel circuit for evaluation having a configuration similar to that of the pixel circuits PK and may be connected to an electrode pad.

Second Embodiment

Next, a second embodiment of the disclosure will be described with reference to (a) of FIG. 11 and (b) of FIG. 11. The display device 1' of the present embodiment is different from that of the first embodiment in that the second spacer PSO is provided also in the opening KA overlapping the electrode pad PAD1 having the island shape among the plurality of openings KA of the metal layer CDL1, and other configurations are the same as those described in the first embodiment. For convenience of explanation, components having the same functions as those described in views according to the first embodiment are appended with the same reference signs, and descriptions thereof may be omitted.

Figure 11:
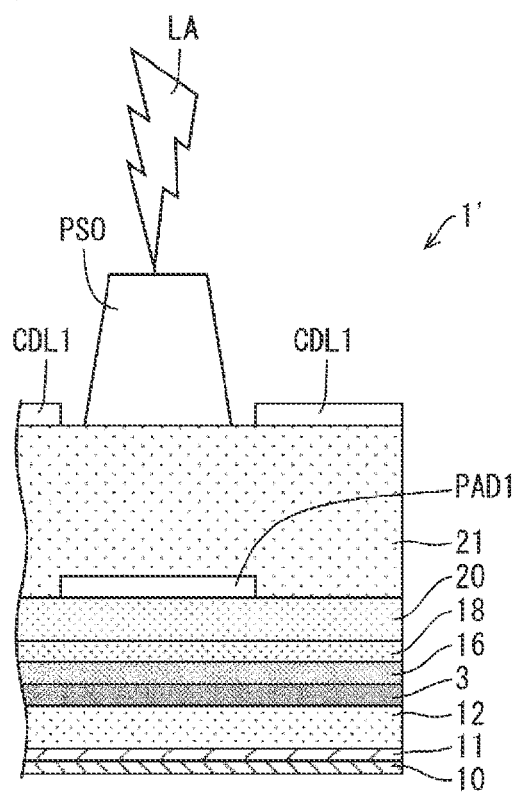
FIGS. 11(*a*) and (*b*) are views for explaining a step of removing a second spacer and an interlayer insulating film via an opening of a metal layer provided in the display device according to a second embodiment to expose the electrode pad.
Figure 11:
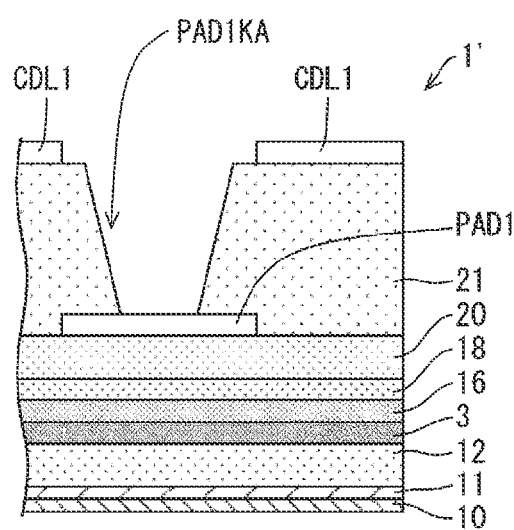

(a) of FIG. 11 and (b) of FIG. 11 are views for explaining a step of removing the second spacer PSO and the interlayer insulating film (flattening film) 21 via the opening KA of the metal layer CDL1 provided in the display device 1' of the second embodiment to expose the electrode pad PAD1.

Note that (a) of FIG. 11 and (b) of FIG. 11 do not illustrate the sealing layer 6 including the first inorganic sealing film 26, the organic sealing film 27 and the second inorganic sealing film 28 illustrated in FIGS. 5 and 6 formed so as to cover the metal layer CDL1, the second spacer PSO, and the interlayer insulating film 21.

As illustrated in (a) of FIG. 11 and (b) of FIG. 11, in the display device 1', the second spacer PSO is also provided, for example, in the opening KA overlapping the electrode pad PAD1 having the island shape among the plurality of openings KA of the metal layer CDL1. In this way, the second spacer PSO is also provided in the opening KA overlapping the electrode pad PAD1 among the plurality of openings KA of the metal layer CDL1, and thus for example, the vapor deposition mask used when depositing the light-emitting layer of each color included in a corresponding one of the function layers 24R, 24G, and 24B can be more stably supported by the first spacer PSI and the second spacer PSO.

As illustrated in (a) of FIG. 11, by irradiating the sealing layer 6 (illustrated in FIG. 5) overlapping the electrode pad PAD1, the second spacer PSO provided in the opening KA overlapping the electrode pad PAD1 among the plurality of openings KA of the metal layer CDL1 and the interlayer insulating film 21 on the electrode pad PAD1 with, for example, a laser, and removing the sealing layer 6 (illustrated in FIG. 5), the second spacer PSO, and the interlayer insulating film 21 on the electrode pad PAD1 having the island shape, an opening PAD1KA can be formed in the sealing layer 6 (illustrated in FIG. 5) and the interlayer insulating film 21 on the electrode pad PAD1 having the island shape.

As described above, the method for inspecting the display device 1' illustrated in (a) of FIG. 11 and (b) of FIG. 11 includes the step of removing the sealing layer 6 (illustrated in FIG. 5) overlapping the electrode pad PAD1 and the second spacer PSO provided in the opening KA overlapping the electrode pad PAD1, and the step of removing the interlayer insulating film 21 via the opening KA of the metal layer CDL1 in the position where the electrode pad PAD1, the interlayer insulating film 21, and the opening KA of the metal layer CDL1 are overlapping each other to expose the electrode pad PAD1.

In the present embodiment, a description will be given using, as an example, a case in which the laser is used for removing the sealing layer 6 (illustrated in FIG. 5), the second spacer PSO, and the interlayer insulating film 21, but the method is not limited thereto, and the sealing layer 6 (illustrated in FIG. 5), the second spacer PSO, and the interlayer insulating film 21 may be removed by, for example, poking with a needle or the like.

As described above, in the display device 1' according to the second embodiment, the electrode pad PAD1 overlaps the opening KA of the metal layer CDL1 via the interlayer insulating film 21, and even in the case where the sealing layer 6 and the second spacer PSO formed of the organic material are formed, the position confirmation of the electrode pad PAD1 can be easily performed. In addition, when performing analysis or inspection of the display device 1', the removal of the metal layer CDL1 is not required.

Further, the method for inspecting the display device 1' according to the second embodiment includes the step of removing the sealing layer 6 (illustrated in FIG. 5) overlapping the electrode pad PAD1 and the second spacer PSO provided in the opening KA overlapping the electrode pad PAD1, and the step of removing the interlayer insulating film 21 via the opening KA of the metal layer CDL1 in the position where the electrode pad PAD1, the interlayer insulating film 21, and the opening KA of the metal layer CDL1 are overlapping each other to expose the electrode pad PAD1, and thus the position confirmation of the electrode pad PAD1 can be easily performed, and when performing analysis or inspection of the display device 1', the removal of the metal layer CDL1 is not required.

Note that in the present embodiment, the description has been given using, as the example, the case in which the sealing layer 6 illustrated in FIG. 5 is also removed to expose the electrode pad PAD1, but the method is not limited thereto, and for example, in a case where the electrode pad PAD1 is exposed when the inspection is necessary before the step of forming the sealing layer 6, in other words, before the display device 1' becomes a finished product, the sealing layer 6 is not required to be removed.

Third Embodiment

Next, a third embodiment according to the disclosure will be described with reference to FIG. 12 to FIG. 14. A display device 1" of the present embodiment is different from that of the first and second embodiments in that some of the electrode pads PAD8 to PAD10 are parts of portions where the data signal lines Dm−2, Dm−1, and Dm, respectively, of the pixel circuits PK extend to the frame region NDA, the scanning-side drive circuit 32' includes third output lines DG1 and DE1 not electrically connected to the pixel circuits PK provided in the display region DA, and an electrode pad electrically connected to the third output lines is included and other configurations are the same as those described in the first and the second embodiments. For the sake of the description, members having the same functions as the members illustrated in the views in the first and second embodiments are denoted by the same reference numerals, and descriptions thereof will be omitted.

Figure 12:
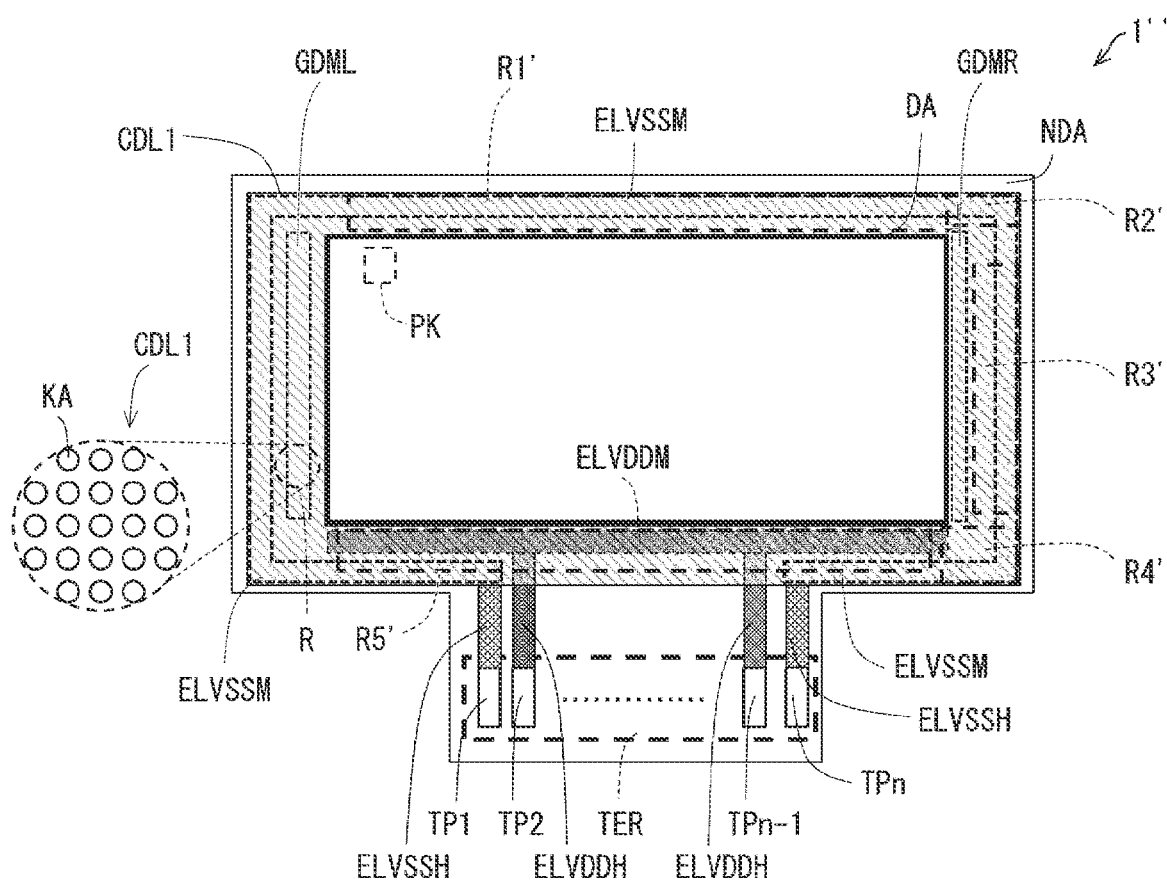
FIG. 12 is a view illustrating a schematic configuration of a display device according to a third embodiment.

FIG. 12 is a view illustrating a schematic configuration of the display device 1" according to the third embodiment.

As illustrated in FIG. 12, in the display device 1", the scanning-side drive circuits 32' are provided in a GDML region serving as the frame region NDA on the left side of the display region DA, and a GDMR region serving as the frame region NDA on the right side of the display region DA.

Note that, in the present embodiment, a description will be given using, as an example, a case in which the plurality of electrode pads (not illustrated) are provided in an R1' region, an R2' region, an R3' region, an R4', and an R5' region illustrated in FIG. 12 in the frame region NDA of the display device 1" in a distributed manner, but the method is not limited thereto, and the regions of the plurality of electrode pads are not particularly limited as long as the plurality of electrode pads are provided in the frame region NDA of the display device 1".

Figure 13:
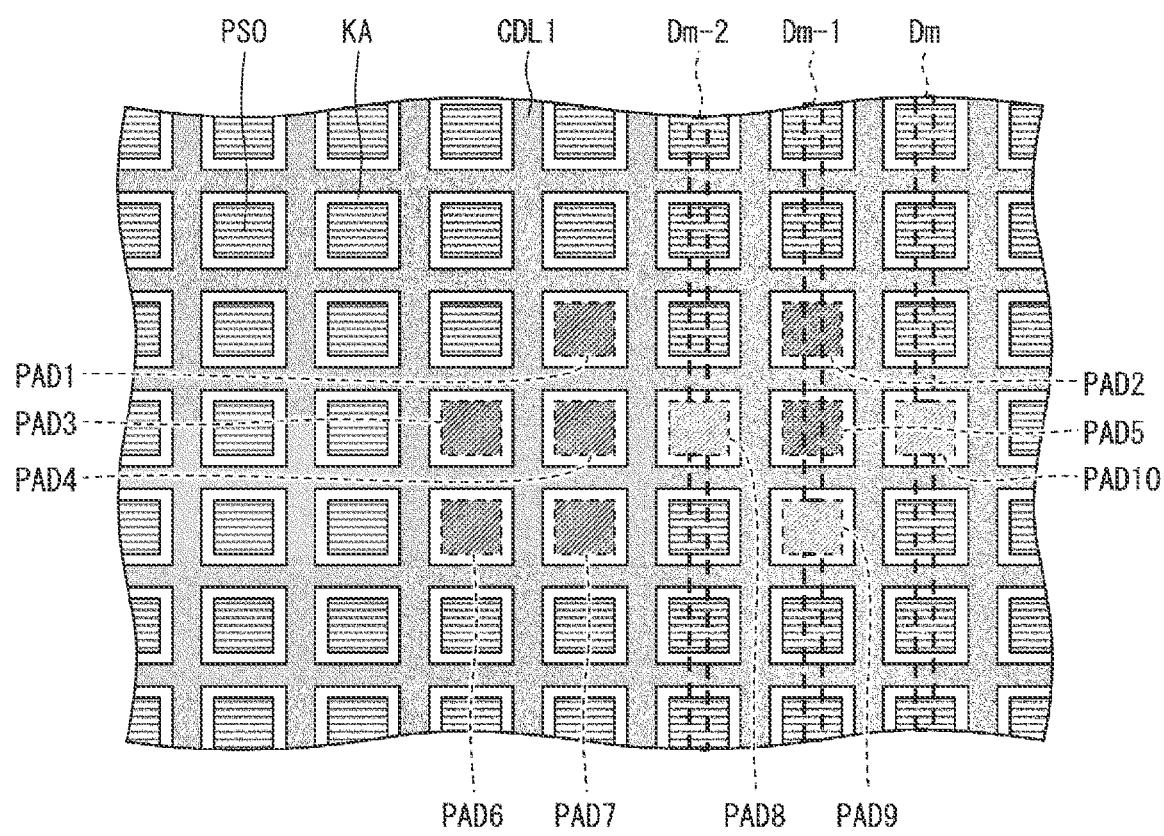
FIG. 13 is a partially enlarged view of an R5' region of the display device according to the third embodiment illustrated in FIG. 12.

FIG. 13 is a partially enlarged view of the R5' region of the display device 1" illustrated in FIG. 12.

As illustrated in FIG. 12 and FIG. 13, the electrode pads PAD8 to PAD10 electrically connected to the data signal lines Dm−2, Dm−1, and Dm, respectively, of the pixel circuit PK are preferably provided between the display region DA and the terminal portion TER.

As illustrated in FIG. 13, in the R5' region of the display device 1", each of the plurality of data signal lines Dm extends to the terminal portion TER illustrated in FIG. 12. Then, in the middle, for example, the electrode pads PAD8, PAD9, and PAD10 in the data signal lines Dm−2, Dm−1, and Dm, respectively, are formed of the same layer and the same material as the data signal lines. In other words, the electrode pads PAD8 to PAD10 are wide portions of the data signal lines Dm−2 to Dm, respectively. Note that, since the extending portions of the data signal lines Dm−2 to Dm of the pixel circuit PK in the frame region NDA do not intersect with the other electrode pads PAD1 to PAD7, the extending portions of the data signal lines Dm−2 to Dm of the pixel circuits PK can be formed of the layer SH forming the drain electrodes of the plurality of transistors such as the second initialization transistor T7 illustrated in FIGS. 5 and 6 and the wiring lines of the electrodes, which is the same layer and the same material as the data signal lines Dm−2 to Dm of the pixel circuit PK. Note that the extending portions of the data signal lines Dm−2 to Dm of the pixel circuit PK are preferably formed such that line widths of portions corresponding to the electrode pads PAD8 to PAD10 are wider than line widths of the other portions.

On the other hand, although not illustrated, in a case where the extending portions of the data signal lines of the pixel circuit PK intersect with the other electrode pads, a layer that does not intersect with the other electrode pads may be used.

Note that in the display device 1", the electrode pads PAD8 to PAD10 electrically connected to the data signal lines Dm−2, Dm−1, and Dm, respectively, of the pixel circuit PK may be provided not only in the R5' region (first region) between the display region DA and the terminal portion TER illustrated in FIG. 12 but also in the R1' region (second region) interposing the display region DA between the R1' region and the R5' region (first region) illustrated in FIG. 12.

Figure 14:
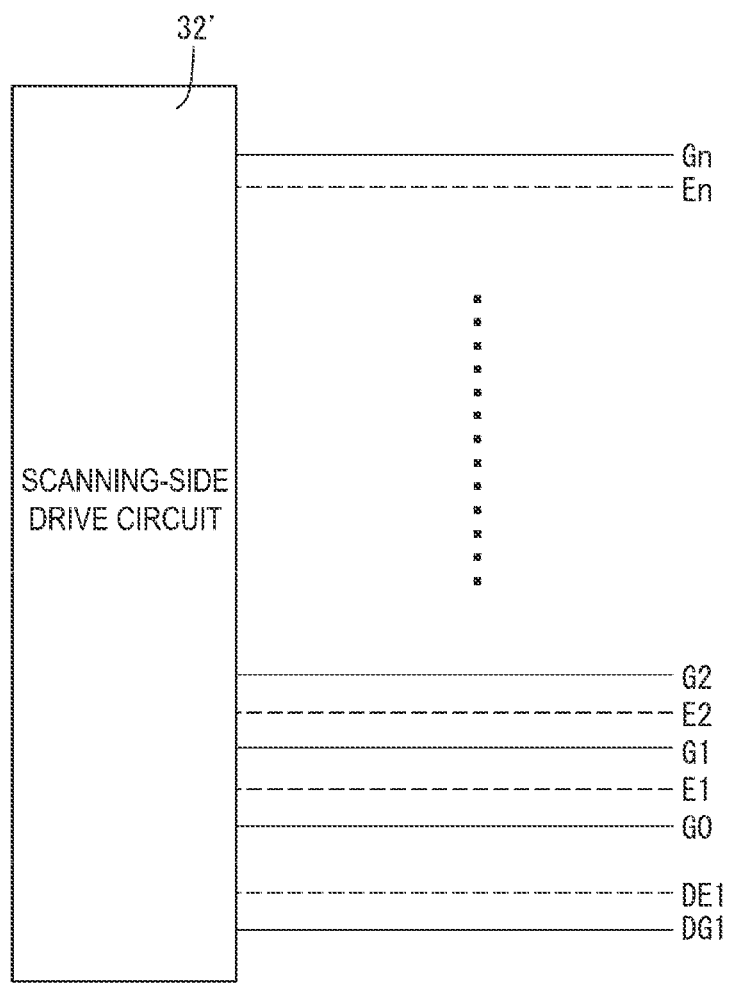
FIG. 14 is a view illustrating an example of a scanning-side drive circuit of the display device according to the third embodiment illustrated in FIG. 12.
Figure 15:
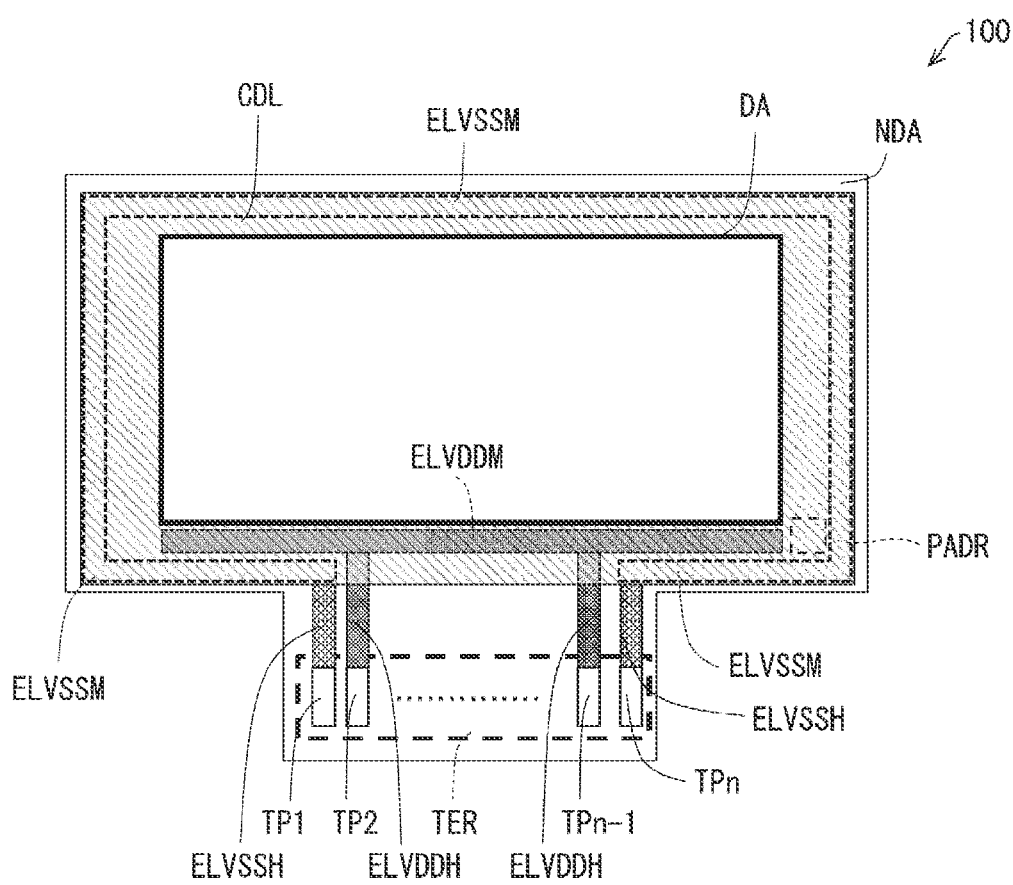
FIG. 15 is a view illustrating a schematic configuration of a known display device in which a metal layer is formed in a frame-like shape in a frame region.

FIG. 14 is a view illustrating an example of a scanning-side drive circuit 32' of the display device 1" illustrated in FIG. 12.

As illustrated in FIG. 14, the scanning-side drive circuit 32' includes the first output line (not illustrated) electrically connected to the scanning signal lines G0 to Gn of the pixel circuit PK provided in the display region DA, the second output line (not illustrated) electrically connected to the light emission control lines E1 to En of the pixel circuit PK provided in the display region DA, and the third output lines DG1 and DE1 not electrically connected to the pixel circuit PK provided in the display region DA. Note that in a case where the third output lines DG1 and DE1 are not electrically connected to the pixel circuit PK provided in the display region DA, the third output lines DG1 and DE1 may be formed from the scanning-side drive circuit 32' into the display region DA.

The display device 1" includes electrode pads each electrically connected with corresponding one of the third output lines DG1 and DE1, in other words dummy wiring lines for analysis or inspection. As described above, by providing the electrode pads each electrically connected to the corresponding one of the third output lines DG1 and DE1 not electrically connected to the pixel circuit PK provided in the display region DA, it makes it possible to eliminate influence on display quality of the display device which may be caused by providing the electrode pads for analysis or inspection.

Note that since the third output lines DG1 and DE1, in other words, the dummy wiring lines for analysis or inspection are typically provided at an upper end portion or a lower end portion of the display region DA illustrated in FIG. 12, the electrode pads each electrically connected to the corresponding one of the third output lines DG1 and DE1 are preferably provided in any of four corner regions each corresponding to one of four corners of the display region DA in the frame region NDA, as in the R2' region and the R4' region illustrated in FIG. 12.

Note that in the present embodiment, the description has been given using, as the example, the case in which the sealing layer 6 illustrated in FIG. 5 is also removed to expose the electrode pads PAD8 to PAD10, but the method is not limited thereto, and for example, in a case where the electrode pads PAD8 to PAD10 are exposed when the inspection is necessary before the step of forming the sealing layer 6, in other words, before the display device 1" becomes a finished product, the sealing layer 6 is not required to be removed.

Supplement

First Aspect

A display device includes a display region, a frame region in a periphery of the display region, and a plurality of light-emitting elements provided in the display region, wherein the display region and the frame region include a flattening film, each of the plurality of light-emitting elements provided on the flattening film includes a first electrode, a light-emitting layer, and a second electrode in this order from the flattening film side, the display region includes a first spacer between the plurality of light-emitting elements, the frame region includes a second spacer and a metal layer electrically connected to the second electrode and formed of a same layer and a same material as the first electrode, the metal layer includes a plurality of openings, the frame region includes an electrode pad having an island shape, and the electrode pad overlaps one or more of the plurality of openings via an insulating film including at least the flattening film.

Second Aspect

The display device according to the first aspect, wherein the second spacer is formed of an organic material, and an opening of the plurality of openings overlapping the electrode pad overlaps the second spacer.

Third Aspect

The display device according to the first aspect, wherein an opening of the plurality of openings overlapping the electrode pad does not overlap the second spacer.

Fourth Aspect

The display device according to any one of the first to third aspects, wherein, in the flattening film, a semiconductor film, a gate insulating film, a first wiring line layer, a first inorganic insulating film, a second wiring line layer, a second inorganic insulating film, and a third wiring line layer are provided in order of distance far from the flattening film, on an side opposite of a side on which the plurality of light-emitting elements are provided, the electrode pad is included in the third wiring line layer, and the electrode pad overlaps one or more of the plurality of openings via the flattening film.

Fifth Aspect

The display device according to any one of the first to third aspects, wherein, in the flattening film, a semiconductor film, a gate insulating film, a first wiring line layer, a first inorganic insulating film, a second wiring line layer, a second inorganic insulating film, and a third wiring line layer are provided in order of distance far from the flattening film, on an opposite side of a side on which the plurality of light-emitting elements are provided, the electrode pad is included in the second wiring line layer, and the electrode pad overlaps one or more of the plurality of openings via the flattening film and the second inorganic insulating film.

Sixth Aspect

The display device according to any one of the first to third aspects, wherein, in the flattening film, a semiconductor film, a gate insulating film, a first wiring line layer, a first inorganic insulating film, a second wiring line layer, a second inorganic insulating film, and a third wiring line layer are provided in order of distance far from the flattening film, on an opposite side of a side on which the plurality of light-emitting elements are provided, the electrode pad is included in the first wiring line layer, and the electrode pad overlaps one or more of the plurality of openings via the flattening film, the second inorganic insulating film, and the first inorganic insulating film.

Seventh Aspect

The display device according to any one of the first to sixth aspects, wherein the electrode pad is electrically connected to one node in a circuit provided in the display region or the frame region.

Eighth Aspect

The display device according to the seventh aspect, wherein the circuit provided in the display region is a pixel circuit, and the electrode pad is electrically connected to one node of the pixel circuit.

Ninth Aspect

The display device according to the eighth aspect, wherein the pixel circuit includes a data signal line, a scanning signal line, and a light emission control line, and the electrode pad is electrically connected to the data signal line.

Tenth Aspect

The display device according to the ninth aspect, wherein a terminal portion is further provided on an end portion of at least one side in the frame region, and the electrode pad electrically connected to the data signal line is provided in the frame region between the display region and the terminal portion.

Eleventh Aspect

The display device according to the ninth aspect, wherein a terminal portion is further provided on an end portion of at least one side in the frame region, and the electrode pad electrically connected to the data signal line is provided in a first region between the display region and the terminal portion and a second region facing the first region with the display region interposed between the first region and the second region.

Twelfth Aspect

The display device according to any one of the ninth to eleventh aspects, wherein the electrode pad electrically connected to the data signal line is a part of a portion where the data signal line of the pixel circuit extends to the frame region.

Thirteenth Aspect

The display device according to the twelfth aspect, wherein the part of the portion where the data signal line of the pixel circuit extends to the frame region overlaps one or more of the plurality of openings of the metal layer.

Fourteenth Aspect

The display device according to the twelfth aspect or the thirteenth aspect, wherein the portion where the data signal line of the pixel circuit extends to the frame region is formed in a manner that a line width of a portion corresponding to the electrode pad is wider than a line width of the other portion.

Fifteenth Aspect

The display device according to the eighth aspect, wherein the pixel circuit includes a data signal line, a scanning signal line, and a light emission control line, and the electrode pad is electrically connected to the scanning signal line.

Sixteenth Aspect

The display device according to the eighth aspect, wherein the pixel circuit includes a data signal line, a scanning signal line, and a light emission control line, and the electrode pad is electrically connected to the light emission control line.

Seventeenth Aspect

The display device according to the seventh aspect, wherein the circuit provided in the frame region is a drive circuit, and the electrode pad is electrically connected to one node of the drive circuit.

Eighteenth Aspect

The display device according to the seventeenth aspect, wherein the drive circuit includes a first output line electrically connected to a scanning signal line of a pixel circuit provided in the display region, and a second output line electrically connected to a light emission control line of the pixel circuit provided in the display region, and the electrode pad is electrically connected to the first output line.

Nineteenth Aspect

The display device according to the seventeenth aspect, wherein the drive circuit includes a first output line electrically connected to a scanning signal line of a pixel circuit provided in the display region, and a second output line electrically connected to a light emission control line of the pixel circuit provided in the display region, and the electrode pad is electrically connected to the second output line.

Twentieth Aspect

The display device according to the seventeenth aspect, wherein the drive circuit includes a first output line electrically connected to a scanning signal line of a pixel circuit provided in the display region, a second output line electrically connected to a light emission control line of the pixel circuit provided in the display region, and a third output line not electrically connected to the pixel circuit provided in the display region, and the electrode pad is electrically connected to the third output line.

Twenty-First Aspect

The display device according to the twentieth aspect, wherein the electrode pad electrically connected to the third output line is provided in any of four corner regions each corresponding to one of four corners of the display region in the frame region.

Twenty-Second Aspect

The display device according to any one of the first to twenty-first aspects, wherein the frame region includes a trench formed in the flattening film and surrounding the display region in a frame-like shape and a bank surrounding the trench in the frame-like shape, and the metal layer is provided at least between the trench and the bank.

Twenty-Third Aspect

The display device according to the twenty-second aspect, wherein the second electrode and the metal layer are electrically connected to each other in at least one of the trench and a region between the trench and the display region, and the electrode pad overlaps the opening provided between the trench and the bank.

Twenty-Fourth Aspect

The display device according to the twenty-second aspect, wherein the second electrode is light-transmissive, and the second electrode and the metal layer are electrically connected to each other in at least one of the trench and a region between the trench and the display region, and the electrode pad overlaps the opening provided between the display region and the trench, and an extending portion of the second electrode provided between the display region and the trench.

Twenty-Fifth Aspect

A method for inspecting a display device is a method for inspecting a display device including a display region, a frame region in a periphery of the display region, and a plurality of light-emitting elements provided in the display region, the display region and the frame region including a flattening film, each of the plurality of light-emitting elements provided on the flattening film including a first electrode, a light-emitting layer, and a second electrode in this order from the flattening film side, the frame region including a metal layer electrically connected to the second electrode and formed of a same layer and a same material as the first electrode, the metal layer including a plurality of openings, the frame region including an electrode pad having an island shape, the electrode pad overlapping one or more of the plurality of openings via an insulating film including at least the flattening film, the method including confirming a position of the electrode pad from the one or more of the plurality of openings.

Twenty-Sixth Aspect

The method for inspecting the display device according to the twenty-fifth aspect, further comprising removing the insulating film via the opening in a portion where the electrode pad, the insulating film, and the opening portion overlap each other to expose the electrode pad.

APPENDIX

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

INDUSTRIAL APPLICABILITY

The disclosure can be utilized for a display device or a method for inspecting a display device.

The invention claimed is:

1. A display device comprising:
a display region;
a frame region in a periphery of the display region; and
a plurality of light-emitting elements provided in the display region,
wherein the display region and the frame region include a flattening film,
each of the plurality of light-emitting elements provided on the flattening film includes a first electrode, a light-emitting layer, and a second electrode in this order from a side of the flattening film,
the display region includes a first spacer between the plurality of light-emitting elements,
the frame region includes a second spacer and a metal layer electrically connected to the second electrode and formed of a same layer and a same material as the first electrode,
the metal layer includes a plurality of openings,
the frame region further includes an electrode pad having an island shape,
the electrode pad overlaps one or more of the plurality of openings via an insulating film including at least the flattening film, each of the plurality of openings being located between a first part of the metal layer and a second part of the metal layer that are adjacent to each other and that are formed on the flattening film, and
the one or more of the plurality of openings overlapping the electrode pad do not overlap the second spacer.

2. The display device according to claim 1, wherein the second spacer is formed of an organic material.

3. The display device according to claim 1, wherein, in the flattening film, a semiconductor film, a gate insulating film, a first wiring line layer, a first inorganic insulating film, a second wiring line layer, a second inorganic insulating film, and a third wiring line layer are provided in an order of distance farther from the flattening film, on an opposite side of a side on which the plurality of light-emitting elements is provided, the electrode pad is included in the third wiring line layer, and the electrode pad overlaps the one or more of the plurality of openings via the flattening film.

4. The display device according to claim 1, wherein, in the flattening film, a semiconductor film, a gate insulating film, a first wiring line layer, a first inorganic insulating film, a second wiring line layer, a second inorganic insulating film, and a third wiring line layer are provided in an order of distance farther from the flattening film, on an opposite side of a side on which the plurality of light-emitting elements is provided, the electrode pad is included in the second wiring line layer, and the electrode pad overlaps the one or more of the plurality of openings via the flattening film and the second inorganic insulating film.

5. The display device according to claim 1, wherein, in the flattening film, a semiconductor film, a gate insulating film, a first wiring line layer, a first inorganic insulating film, a second wiring line layer, a second inorganic insulating film, and a third wiring line layer are provided in an order of distance farther from the flattening film, on an opposite side of a side on which the plurality of light-emitting elements is provided, the electrode pad is included in the first wiring line layer, and the electrode pad overlaps the one or more of the plurality of openings via the flattening film, the second inorganic insulating film, and the first inorganic insulating film.

6. The display device according to claim 1, wherein the electrode pad is electrically connected to one node in a circuit provided in the display region or the frame region.

7. The display device according to claim 6, wherein the circuit provided in the display region is a pixel circuit, and the electrode pad is electrically connected to one node of the pixel circuit.

8. The display device according to claim 7, wherein the pixel circuit includes a data signal line, a scanning signal line, and a light emission control line, and the electrode pad is electrically connected to the data signal line.

9. The display device according to claim 8, wherein a terminal portion is provided on an end portion of at least one side in the frame region, and the electrode pad electrically connected to the data signal line is provided in the frame region between the display region and the terminal portion.

10. The display device according to claim 8, wherein a terminal portion is provided on an end portion of at least one side in the frame region, and the electrode pad electrically connected to the data signal line is provided in a first region between the display region and the terminal portion and a second region facing the first region with the display region interposed.

11. The display device according to claim 8, wherein the electrode pad electrically connected to the data signal line is a part of a portion where the data signal line of the pixel circuit extends to the frame region.

12. The display device according to claim 11, wherein the part of the portion where the data signal line of the pixel circuit extends to the frame region overlaps the one or more of the plurality of openings of the metal layer.

13. The display device according to claim 11, wherein the portion where the data signal line of the pixel circuit extends to the frame region is formed in a manner that a line width of a portion corresponding to the electrode pad is wider than a line width of another portion other than the portion corresponding to the electrode pad.

14. The display device according to claim 7, wherein the pixel circuit includes a data signal line, a scanning signal line, and a light emission control line, and the electrode pad is electrically connected to the scanning signal line.

15. The display device according to claim 7, wherein the pixel circuit includes a data signal line, a scanning signal line, and a light emission control line, and the electrode pad is electrically connected to the light emission control line.

16. The display device according to claim 6, wherein the circuit provided in the frame region is a drive circuit, and the electrode pad is electrically connected to one node of the drive circuit.

17. The display device according to claim 1, wherein the frame region further includes:

a trench formed in the flattening film and surrounding the display region in a frame-like shape, and a bank surrounding the trench in the frame-like shape, and the metal layer is provided at least between the trench and the bank.

18. The display device according to claim 17, wherein the second electrode and the metal layer are electrically connected to each other in at least one of the trench and a region between the trench and the display region, and the electrode pad overlaps an opening provided between the trench and the bank.

19. The display device according to claim 17, wherein the second electrode is light-transmissive, the second electrode and the metal layer are electrically connected to each other in at least one of the trench and a region between the trench and the display region, and the electrode pad overlaps an opening provided between the display region and the trench, and an extending portion of the second electrode provided between the display region and the trench.

* * * * *